United States Patent
Guo et al.

(10) Patent No.: US 10,742,113 B2
(45) Date of Patent: Aug. 11, 2020

(54) CONTROL CIRCUIT AND CONTROL METHOD FOR OUTPUTTING PULSE WIDTH MODULATION CONTROL SIGNAL WITH ZERO-CROSSING DETECTION

(71) Applicant: Delta Electronics (Shanghai) Co., Ltd., Shanghai (CN)

(72) Inventors: Kang Guo, Shanghai (CN); Hongyuan Jin, Shanghai (CN); Hongbao Wang, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 16/560,986

(22) Filed: Sep. 4, 2019

(65) Prior Publication Data

US 2020/0014296 A1    Jan. 9, 2020

Related U.S. Application Data

(63) Continuation-in-part of application No. 16/231,929, filed on Dec. 24, 2018, now Pat. No. 10,461,628.

(30) Foreign Application Priority Data

May 17, 2018 (CN) .......................... 2018 1 0476335
Aug. 29, 2019 (CN) ..................... 2019 2 1425895 U

(51) Int. Cl.
*H02M 1/42* (2007.01)
*G01R 19/175* (2006.01)
(Continued)

(52) U.S. Cl.
CPC ........ *H02M 1/4208* (2013.01); *G01R 19/175* (2013.01); *H02M 1/083* (2013.01);
(Continued)

(58) Field of Classification Search
CPC .... H02M 1/4208; H02M 1/083; H02M 7/162; H02M 2007/2195; G01R 19/175; H03K 5/1536
See application file for complete search history.

(56) References Cited

U.S. PATENT DOCUMENTS 7,042,743 B2 * 5/2006 Pidutti ................ H02M 1/4225
                                                            363/89
7,884,588 B2 * 2/2011 Adragna ............. H02M 3/1584
                                                            323/272
(Continued)

FOREIGN PATENT DOCUMENTS

CN    201557044 U    8/2010
CN    103326564 A    9/2013

*Primary Examiner* — Jue Zhang
(74) *Attorney, Agent, or Firm* — CKC & Partners Co., LLC

(57) ABSTRACT

The present disclosure provides a control circuit, where the control circuit includes: a signal detection unit, a zero-crossing detection (ZCD) signal acquisition unit, a pulse width modulation (PWM) control signal generation unit, and a signal processing unit; where the signal detection unit, the ZCD signal acquisition unit, the PWM control signal generation unit and the signal processing unit are connected in cascade. The control circuit provided in the present disclosure reduces processing delay of a ZCD signal and improve signal a processing accuracy of a power factor correction (PFC) system.

13 Claims, 32 Drawing Sheets

(51) Int. Cl.
*H03K 5/1536* (2006.01)
*H02M 7/162* (2006.01)
*H02M 1/08* (2006.01)
*H02M 7/219* (2006.01)

(52) U.S. Cl.
CPC .......... *H02M 7/162* (2013.01); *H03K 5/1536* (2013.01); *H02M 2007/2195* (2013.01)

(56) References Cited

U.S. PATENT DOCUMENTS

| | | | |
|---|---|---|---|
| 10,461,628 B1* | 10/2019 | Wang | H02M 1/083 |
| 2013/0249504 A1* | 9/2013 | Hsu | H02M 1/4225 323/207 |
| 2018/0054113 A1* | 2/2018 | Kim | H02M 1/12 |

* cited by examiner

CONTROL CIRCUIT AND CONTROL METHOD FOR OUTPUTTING PULSE WIDTH MODULATION CONTROL SIGNAL WITH ZERO-CROSSING DETECTION

CROSS-REFERENCE TO RELATED APPLICATION

This application is a continuation-in-part application of U.S. Ser. No. 16/231,929, filed on Dec. 24, 2018. This application claims priority to Chinese Patent Application No. 201921425895.8, filed on Aug. 29, 2019. The US application U.S. Ser. No. 16/231,929 claims priority to Chinese Patent Application No. 201810476335.9, filed on May 17, 2018. The contents of the above identified applications are incorporated herein by reference in their entireties.

TECHNICAL FIELD

The present disclosure relates to the field of circuits and, in particular, to a control circuit and a control method.

BACKGROUND

With the rapid development of electronic technologies, the power rating of power supply equipment continuously increases, and the standard of harmonic currents gets universal and lowered. Nowadays, power factor correction (PFC) converters are increasingly used in power supply designs to improve power factors of electric equipment. The conventional bridge PFC converter is widely used in the front end of AC/DC power stage due to its simple circuit structure and low common-mode noise. However, the energy transfer path will cause high conduction and switching loss as more semiconductor devices are used due to the presence of a rectifying bridge.

In order to reduce the loss of switches in the PFC circuit, a bridgeless PFC has been applied. For application of the bridgeless PFC, the critical problems include phase detection of alternating voltage and zero current detection when the PFC inductor current is in a discontinuous conduction mode boundary (DCMB for short) mode.

In prior art, an AC voltage input into the PFC circuit and a voltage applied on a switching device are obtained by detecting the inductor voltage at the input of the PFC circuit, and a zero-crossing detection signal of the inductor voltage is extracted and sent to a DSP/MCU, which processes the signal in a digital way through sequentially-executed operations such as determination of the phase of the input voltage, selection of the zero-crossing detection (ZCD for short) signal, frequency limiting operation on the zero-crossing detection signal, and the like to generate the control signals of the switches in the PFC circuit.

In the prior art, the operations such as processing of the ZCD signal by the DSP/MCU and frequency limiting operation require high performance of the DSP/MCU, especially when used in high-frequency applications since a significant signal delay will be introduced by DSP/MCU while processing high-frequency ZCD signals, if worse, the accuracy of signal processing in the entire system where the PFC is located will be affected.

SUMMARY

The present disclosure provides a control circuit and a control method, which reduce processing delay of a ZCD signal and improve signal processing accuracy of a PFC system.

The present disclosure provides a control circuit for outputting a pulse width modulation (PWM) control signal, including:

a signal detection unit, coupled to an alternating current (AC)-side inductor of an AC/direct current (DC) converter, which is configured to detect a voltage of the AC-side inductor and output an inductor voltage detection signal, where the inductor voltage detection signal is an AC signal;

a zero-crossing detection (ZCD) signal acquisition unit, coupled to the signal detection unit, which is configured to receive the inductor voltage detection signal, generate a ZCD signal of the voltage of the AC-side inductor, and output the ZCD signal to the PWM control signal generation unit;

a PWM control signal generation unit, coupled to the ZCD signal acquisition unit, which is configured to receive the ZCD signal and an input voltage phase signal, generate, according to the ZCD signal, a pulse signal of a preset threshold frequency and the input voltage phase signal, a ZCD trigger signal having a frequency that is no greater than the preset threshold frequency, and output the ZCD trigger signal to the signal processing unit; and a signal processing unit, coupled to the PWM control signal generation unit, which is configured to receive the ZCD trigger signal, generate a pulse width signal and a pulse signal of a preset threshold frequency, and return the pulse width signal and the pulse signal of the preset threshold frequency to the PWM control signal generation unit;

where the PWM control signal generation unit is further configured to generate a PWM control signal for the AC/DC converter according to the pulse width signal, the input voltage phase signal, the ZCD signal, and the pulse signal of the preset threshold frequency.

In an embodiment of the present disclosure, the signal detection unit, the ZCD signal acquisition unit, and the PWM control signal generation unit are constructed with analog circuits.

In an embodiment of the present disclosure, the signal processing unit includes an analog control chip or a digital control chip.

In an embodiment of the present disclosure, the PWM control signal generation unit is configured to:

when the input voltage phase signal is at a first level, maintain the ZCD trigger signal at a low level if the pulse signal of the preset threshold frequency is at a high level; generate an ascending edge of the ZCD trigger signal upon arrival of a first edge signal for the ZCD signal if the pulse signal of the preset threshold frequency is at a low level.

In an embodiment of the present disclosure, the first edge signal has an ascending edge when the first level is a high level, and the first edge signal has a descending edge when the first level is a low level.

In an embodiment of the present disclosure, the signal processing unit is configured to receive the ZCD trigger signal, generate the pulse width signal having the first preset duration after a first preset delay time has elapsed, and send the pulse width signal to the PWM control signal generation unit.

In an embodiment of the present disclosure, the signal processing unit is configured to receive the ZCD trigger signal, generate the pulse signal of the preset threshold frequency after a second preset delay time has elapsed, and send the pulse signal of the preset threshold frequency to the PWM control signal generation unit, wherein the pulse signal of the preset threshold frequency has a second preset duration.

In an embodiment of the present disclosure, the PWM control signal generation unit is configured such that:

the output PWM control signal for the AC/DC converter is at a high level when any one of the ZCD trigger signal and the pulse width signal is at a high level.

In an embodiment of the present disclosure, the PWM control signal generation unit includes: a first logical NOR gate operator, a D flip-flop with an asynchronous clear function, and a second logical OR gate operator, where:

a first input of the first logical NOR gate operator receives the pulse signal of the preset threshold frequency, and an output of the first logical NOR gate operator is connected to a clear terminal of the D flip-flop;

a data input of the D flip-flop is connected to a high level;

a data output of the D flip-flop is connected to a first input of the second logical OR gate operator;

a second input of the second logical OR gate operator is connected to the pulse width signal; and the second logical OR gate operator outputs the PWM control signal for the AC/DC converter.

In an embodiment of the present disclosure, the PWM control signal generation unit further includes a third logical NOT gate operator, where:

when the first level is a high level, an input of the third logical NOT gate operator receives the input voltage phase signal, an output of the third logical NOT gate operator is connected to a second input of the first logical NOR gate operator, and a clock signal terminal of the D flip-flop receives the ZCD signal;

when the first level is a low level, the input of the third logical NOT gate operator receives the ZCD signal, the output of the third logical NOT gate operator is connected to a clock signal terminal of the D flip-flop the D flip-flop, and the second input of the first logical NOR gate operator receives the input voltage phase signal.

In an embodiment of the present disclosure, the signal detection unit includes a first winding, a second winding, a first resistor, a second resistor, a third resistor, a fourth resistor, a first capacitor, and a second capacitor; where the ZCD signal acquisition unit includes a comparator; the first winding and the second winding are coupled to the AC-side inductor and configured to obtain an voltage applied on a switching device in the AC/DC converter through a voltage of the inductor; a first end of the first winding is connected to a first end of the first resistor, a second end of the first resistor is connected to a first end of the second resistor, a first end of the first capacitor and a negative input of the comparator; a second end of the first winding is connected to a first end of the second winding, a second end of the first capacitor, a first end of the second capacitor, a second end of the second resistor and a first end of the fourth resistor; a second end of the second winding is connected to a first end of the third resistor; and a second end of the third resistor is connected to a second end of the second capacitor, a second end of the fourth resistor and a positive input of the comparator; an output of the comparator outputs the ZCD signal to the PWM control signal generation unit.

In an embodiment of the present disclosure, the ZCD signal includes a positive half cycle of voltage signal and a negative half cycle of voltage signal of the AC-side inductor.

The present disclosure further provides a control method for operating the control circuit described above, comprising:

detecting the voltage of an alternating current (AC)-side inductor;

generating the zero-crossing detection (ZCD) signal according to the voltage of the AC-side inductor;

generating the ZCD trigger signal of a frequency no greater than the preset threshold frequency, according to the ZCD signal, the pulse signal of a preset threshold frequency and the input voltage phase signal;

generating the pulse width signal and the pulse signal of a preset threshold frequency, according to the ZCD trigger signal; and generating the PWM control signal for the AC/DC converter according to the pulse width signal, the input voltage phase signal, the ZCD signal, and the pulse signal of the preset threshold frequency.

The present disclosure provides a control circuit and a control method, reduces processing delay of a ZCD signal and improves signal processing accuracy of a PFC system.

BRIEF DESCRIPTION OF DRAWINGS

In order to describe technical solutions in embodiments of the present disclosure or in the prior art more clearly, accompanying drawings used in the description of the embodiments or the prior art will be briefly described hereunder. Obviously, the described drawings are merely some embodiments of present disclosure. For persons skilled in the art, other drawings may be obtained based on these drawings without any creative effort.

DESCRIPTION OF EMBODIMENTS

The technical solutions in the embodiments of the present disclosure will be described hereunder clearly and completely with reference to accompanying drawings in the embodiments of the present disclosure. Obviously, the described embodiments are only a part of embodiments of the present disclosure, rather than all embodiments of the present disclosure. All other embodiments obtained by persons of ordinary skill in the art based on the embodiments of the present disclosure without any creative effort shall fall into the protection scope of the present disclosure.

Terms such as "first", "second", "third", "fourth", etc. (if present) in the specification and the claims as well as the described accompany drawings of the present disclosure are used to distinguish similar objects, but not intended to describe a specific order or sequence. It will be appreciated that the data used in this way may be interchangeable under appropriate circumstances, such that the embodiments of the present disclosure described herein can be implemented in an order other than those illustrated or described herein, for instance. Moreover, terms such as "include" and "have" and any variation thereof are intended to cover a non-exclusive inclusion, e.g., processes, methods, systems, products or devices that encompass a series of steps or units are not necessarily limited to those steps or units that are clearly listed, but may include other steps or units that are not clearly listed or inherent to these processes, methods, products or devices.

Figure 1A:
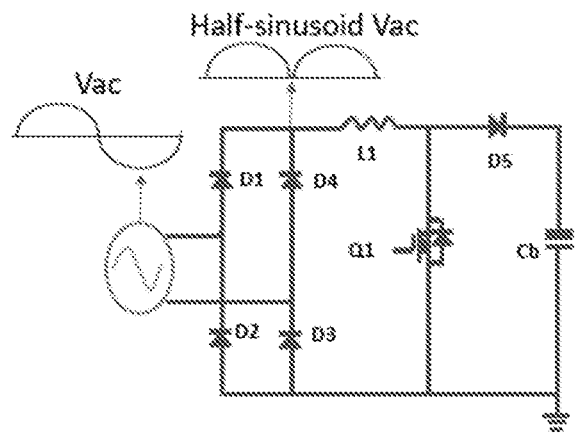
FIG. 1A is a schematic structural diagram of a circuit according to a first conventional PFC system.
Figure 1B:
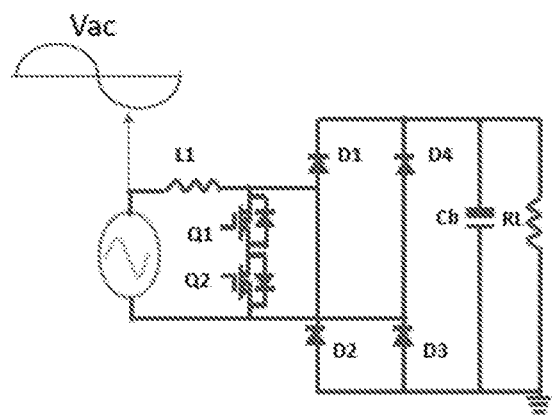
FIG. 1B is a schematic structural diagram of a circuit according to a second conventional PFC system.
Figure 1C:
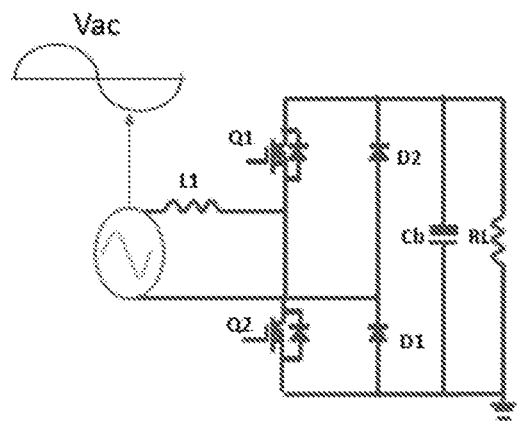
FIG. 1C is a schematic structural diagram of a circuit according to a third conventional PFC system.

FIG. 1A-FIG. 1C are schematic structural diagrams of a circuit of a conventional PFC system. The conventional Boost PFC converter as shown in FIG. 1A is widely used in a front end of the AC/DC power stage due to its simple circuit structure and low common-mode noise. However, due to the existence of a rectifying bridge in the conventional PFC converter, energy passes through three semiconductor devices to form a transfer path, resulting in high conduction and switching loss.

In order to meet needs for power supply products with high efficiency and high power density, and to improve the performance of the Boost PFC converter, the bridgeless PFC has been developed. Since the number of semiconductor devices for energy transfer is reduced, the efficiency of the bridgeless PFC is improved, and the efficiency is improved. FIG. 1B shows a bi-directional switch bridgeless PFC; and FIG. 1C shows a totem-pole bridgeless PFC. In these two bridgeless PFCs the unrectified Vac is applied on the inductors L1, and the voltage of the inductor changes with polarity of the input Vac, furthermore, more switch power devices need to be controlled, which requires more complex voltage detection of the inductor current and control method than the conventional Boost PFC.

Figure 2:
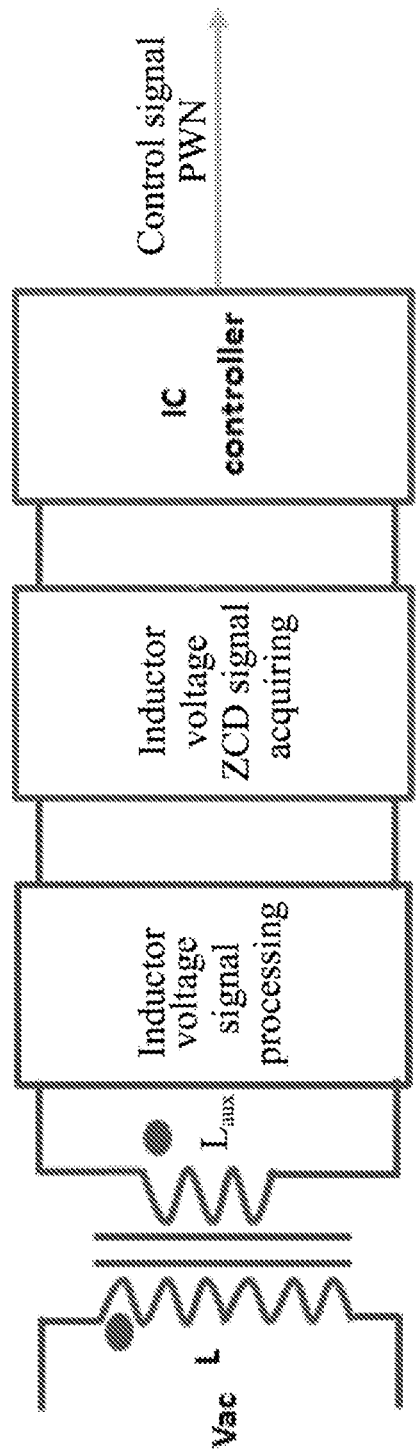
FIG. 2 is a schematic structural diagram of a bridgeless PFC control circuit.

Specifically, FIG. 2 is a schematic structural diagram of a bridgeless PFC control circuit applied to control the circuits of FIG. 1B and FIG. 1C. A voltage signal of the PFC inductor L is detected via an auxiliary winding Laux, and a positive ZCD signal and a negative ZCD signal of the rectified voltage Vac are acquired through signal processing and sent to the IC Controller. The IC Controller may be a digital processor such as a DSP/MCU. The IC controller selects the positive or negative ZCD signal according to a input voltage phase signal, and performs frequency limiting on the selected ZCD signal. Finally, a PWM control signal is generated to control switches Q1 and Q2.

However, using a digital processor to execute the selection and the frequency limiting of the ZCD signal as well as the generation of the PWM control signal will cause a considerable delay to the signal. Especially when applied in the high-frequency field, the delay on control signals of the switches will have a harmful effect on control rapidity and accuracy of the entire system.

Therefore, in order to solve the problem in the prior art described above, the present disclosure provides a control circuit, according to which some of the functions implemented by the processor in the prior art are realized by means of analog circuits to rapidly and directly apply processing results of the ZCD signal to the switch driving circuit, thereby reducing the delay in processing ZCD signal, and improving the accuracy of signal processing in the PFC system. The technical solutions of the present disclosure will be described hereunder in detail with specific embodiments. The following specific embodiments may be combined with each other, and the same or similar concepts or processes may not be repeated in some embodiments.

Figure 3:
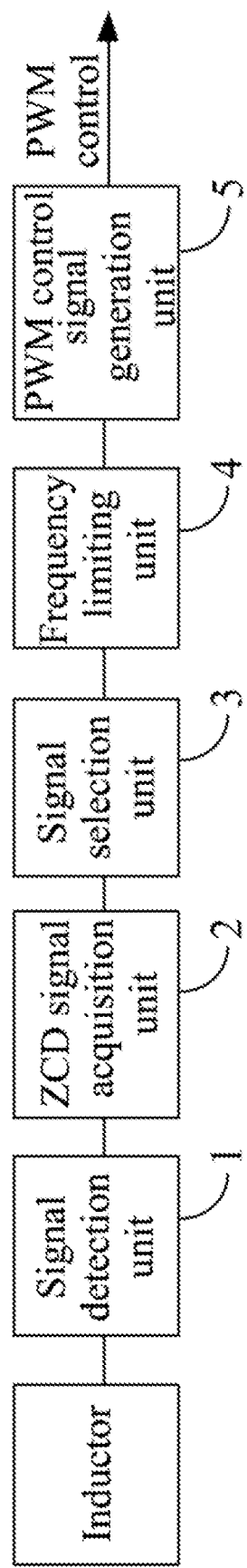
FIG. 3 is a schematic structural diagram of a control circuit according to a first embodiment of the present disclosure.

Specifically, FIG. 3 is a schematic structural diagram of a control circuit according to a first embodiment of the present disclosure. In the first embodiment as shown in FIG. 3, the control circuit includes: a signal detection unit 1, a ZCD signal acquisition unit 2, a signal selection unit 3, a frequency limiting unit 4, and a PWM control signal generation unit 5.

The signal detection unit 1, the ZCD signal acquisition unit 2, the signal selection unit 3, the frequency limiting unit 4, and the PWM control signal generation unit 5 are connected in cascade.

The signal detection unit 1 is further connected to an AC-side inductor of an AC/DC converter and configured to detect a voltage of the AC-side inductor and output an inductor voltage detection signal, where the inductor voltage detection signal is an AC signal. In an embodiment, the inductor in this embodiment is an input inductor of a bridgeless PFC.

The ZCD signal acquisition unit 2 receives the inductor voltage detection signal of the signal detection unit 1, generates a zero-crossing detection signal of the inductor voltage, and sends the zero-crossing detection signal to the signal selection unit 3.

The signal selection unit 3 receives the zero-crossing detection signal, generates an inductor voltage frequency indication signal according to the zero-crossing detection signal, and sends the inductor voltage frequency indication signal to the frequency limiting unit 4.

The frequency limiting unit 4 receives the inductor voltage frequency indication signal transmitted by the signal selection unit 3, and generates, according to a pulse signal of a preset threshold frequency, a ZCD trigger signal with a frequency no greater than the preset threshold frequency, and transmits the ZDC trigger signal to the PWM control signal generation unit 5.

The PWM control signal generation unit 5 receives the ZCD trigger signal transmitted by the frequency limiting unit 4, and generates a PWM control signal for the AC/DC converter according to the ZCD trigger signal. In an embodiment, the PWM control signal generation unit 5 in this embodiment may be a digital processor.

In an embodiment, the signal detection unit 1, the ZCD signal acquisition unit 2, the signal selection unit 3 and the frequency limiting unit 4 in this embodiment are constructed with analog circuits.

In summary, the control circuit provided in this embodiment combines the detection of the inductor voltage, the acquisition and the selection of the ZCD signal, and the frequency limiting of the ZCD signal together by means of different units, which, subsequent to logical processing, generates only a single ZCD trigger signal, so that the PWM control signal generation unit generates a PWM control signal according to the ZCD trigger signal. Compared with the prior art where the selection and the frequency limiting of the inductor voltage ZCD signal as well as the generation of the PWM control signal are all implemented by a digital processor, the signal processing procedure is simplified, the delay of control signal is eliminated, the requirement on performance of the processor is reduced, therefore the requirement of controlling of the entire PFC system is met due to improved accuracy of the signal processing in the PFC system.

Figure 4:
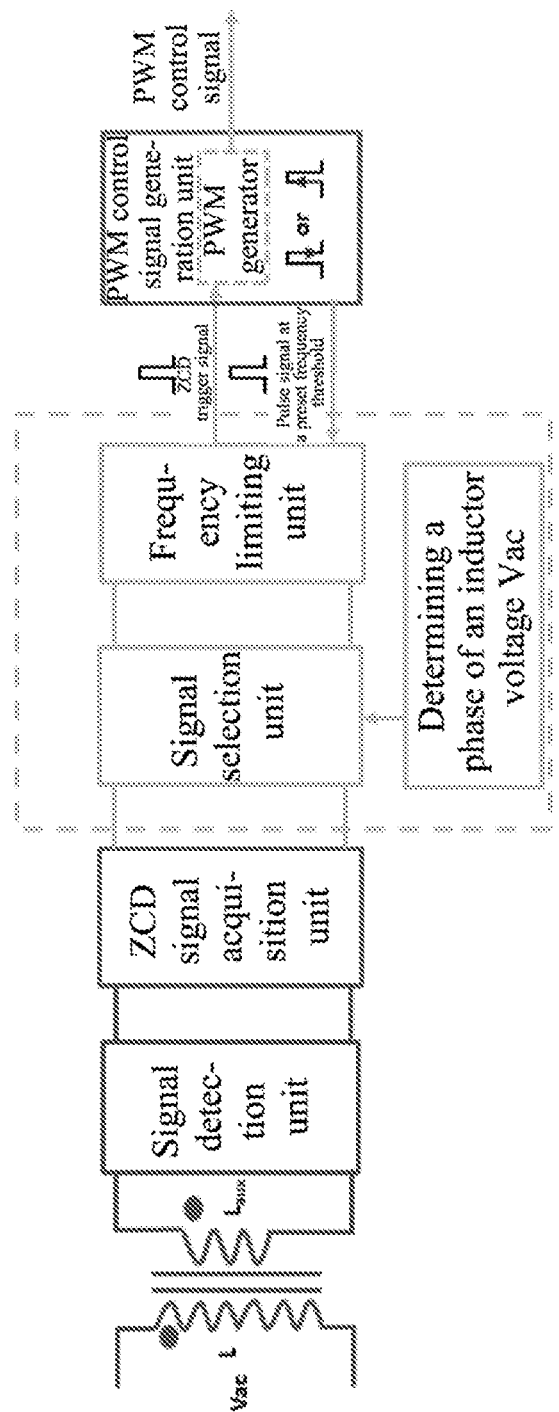
FIG. 4 is a schematic structural diagram of a control circuit according to a second embodiment of the present disclosure.

Further, FIG. 4 is a schematic structural diagram of a control circuit according to a second embodiment of the present disclosure. The control circuit in the second embodiment as shown in FIG. 4 is based on the embodiment as shown in FIG. 3, where the frequency limiting unit is configured such that: a first edge signal of the ZCD trigger signal is generated when both of the pulse signal of the preset threshold frequency and the inductor voltage frequency indication signal are at high voltage levels; the ZCD trigger signal is not inverted when the pulse signal at the preset threshold frequency is at high voltage level; when a descending edge of the pulse signal of the preset threshold frequency arrives, if the inductor voltage frequency indication signal is at low voltage level, then the ZCD trigger signal is inverted to output a second edge signal for the ZCD trigger signal, if the inductor voltage frequency indication signal is at high voltage level, then the ZCD trigger signal is inverted to output a second edge signal when a next descending edge of the inductor voltage frequency indication signal arrives.

One possible implementation of the above-described embodiment lies in: the first edge signal is at high voltage level and the second edge signal is at low voltage level.

Figure 5:
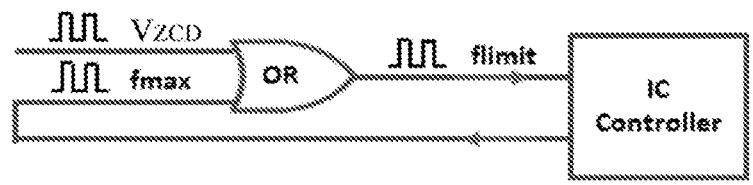
FIG. 5 is a schematic structural diagram of a frequency limiting unit according to a first embodiment of the present disclosure.

Specifically, FIG. 5 is a schematic structural diagram of a frequency limiting unit according to a first embodiment of the present disclosure. As shown in FIG. 5, a frequency limiting unit in this embodiment includes a first logical OR gate operator. One input of the first logical OR gate receives the pulse signal fmax of the preset threshold frequency, transmitted by a PWM control signal generation unit (i.e. the IC Controller in the drawing), the other input receives the inductor voltage frequency indication signal $V_{ZCD}$, sent from the signal selection unit; the first logical OR gate operator performs an OR operation for fmax and $V_{ZCD}$, and the first logical OR gate operator generates a ZCD trigger signal flimit.

Figure 6:
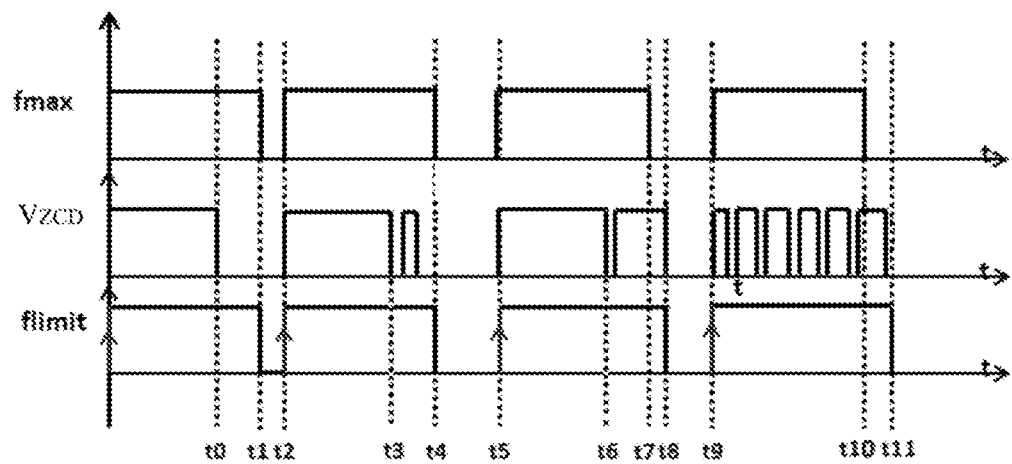
FIG. 6 is a schematic diagram illustrating timing of signals of a frequency limiting unit according to a first embodiment of the present disclosure.

Specifically, FIG. 6 is a schematic diagram illustrating timing of signals of a frequency limiting unit according to a first embodiment of the present disclosure. fmax is the pulse signal of the preset threshold frequency transmitted by the PWM control signal generation unit. $V_{ZCD}$ is the inductor voltage frequency indication signal, and the ZCD trigger signal flimit is generated after $V_{ZCD}$ and fmax are subjected to a logical OR operation. In an embodiment, a pulse width of the PWM is calculated via loop control, depending on an input voltage and an output load. At the time $t_2$, both of the pulse signal fmax of the preset threshold frequency and the inductor voltage frequency indication signal $V_{ZCD}$ are at high voltage levels, a first edge signal for the ZCD trigger signal flimit is generated; during a period when the pulse signal fmax of the preset threshold frequency is at high voltage level, the ZCD trigger signal flimit is not inverted, maintaining the high voltage level; during the time period $[t_3-t_4]$, the ascending edge of $V_{ZCD}$ is invalid, the ZCD trigger signal flimit is not inverted, maintaining the high voltage level; at the time $t_4$, a descending edge of the pulse signal fmax of the preset threshold frequency arrives, at this time the inductor voltage frequency indication signal $V_{ZCD}$ is at low voltage level, and the ZCD trigger signal flimit is inverted to output a second edge signal. During the time period [$t_6$-$t_7$], the ascending edge of $V_{ZCD}$ is invalid, the ZCD trigger signal flimit is not inverted, maintaining the high voltage level. If the inductor voltage frequency indication signal $V_{ZCD}$ is at high voltage level, taking the time $t_7$ as an example, then the ZCD trigger signal flimit maintains high voltage level until a next descending edge of the inductor voltage frequency indication signal $V_{ZCD}$ arrives, that is, at the time $t_8$, the ZCD trigger signal flimit is inverted to output a second edge signal. In an implementation of this embodiment, the first edge signal is at high voltage level, and the second edge signal is at low voltage level.

Figure 7:
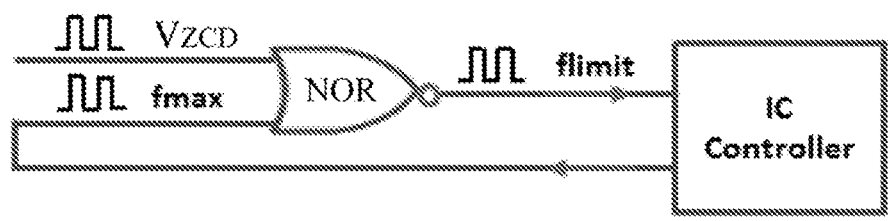
FIG. 7 is a schematic structural diagram of a frequency limiting unit according to a second embodiment of the present disclosure.

Another possible implementation lies in: the first edge signal is at low voltage level and the second edge signal is at high voltage level. Specifically, FIG. 7 is a schematic structural diagram of a frequency limiting unit according to a second embodiment of the present disclosure. As shown in FIG. 7, a frequency limiting unit in this embodiment includes a logical NOR gate operator. One input of the first logical NOR gate receives the pulse signal fmax of the preset threshold frequency, transmitted by a PWM control signal generation unit (i.e. the IC Controller in the drawing), the other input receives the inductor voltage frequency indication signal $V_{ZCD}$, sent from the signal selection unit; the first logical NOR gate operator performs an NOR operation for fmax and $V_{ZCD}$, and the first logical NOR gate operator generates a ZCD trigger signal flimit.

Figure 8:
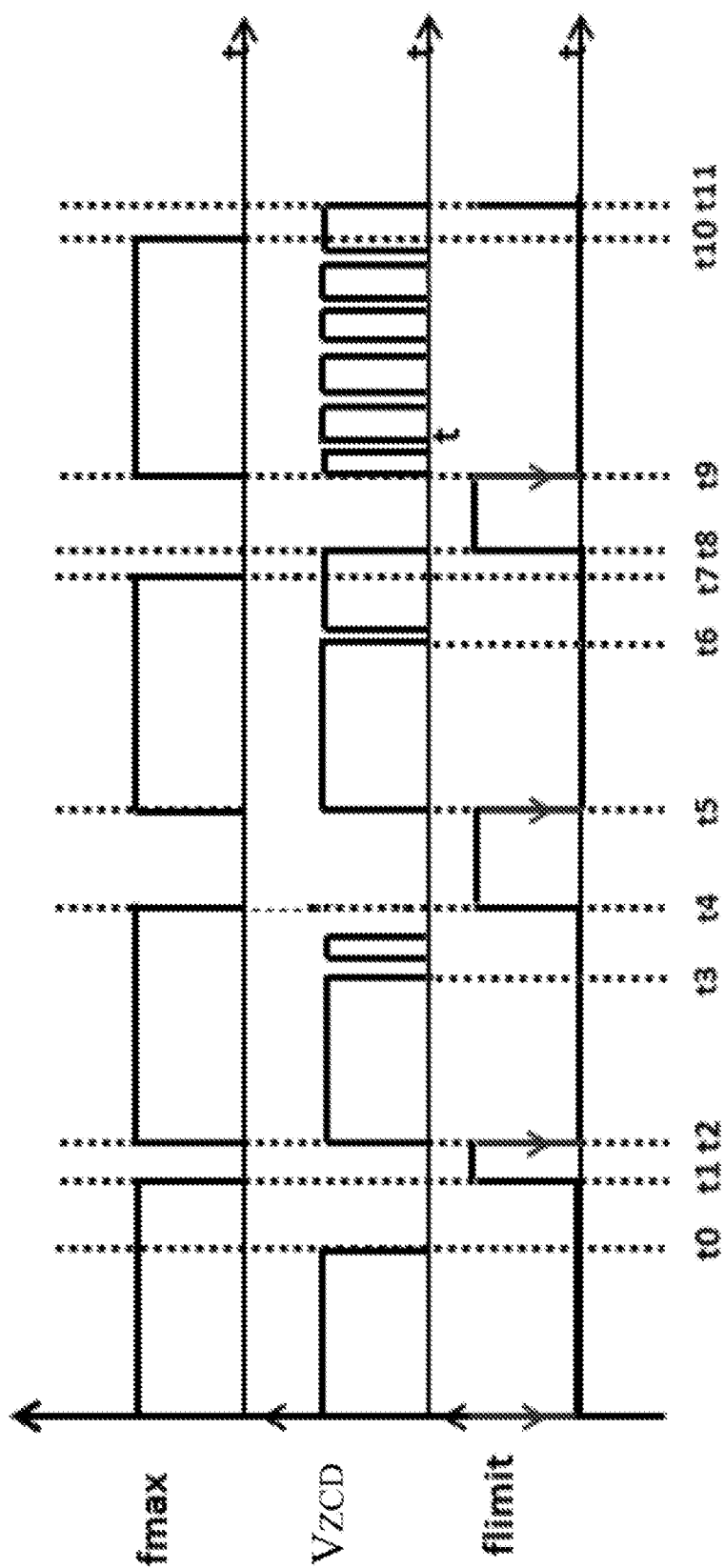
FIG. 8 is a schematic diagram illustrating timing of signals of a frequency limiting unit according to a second embodiment of the present disclosure.

FIG. 8 is a schematic diagram illustrating timing of signals of a frequency limiting unit according to a second embodiment of the present disclosure. Similarly, fmax is the pulse signal of the preset threshold frequency transmitted by the PWM control signal generation unit; $V_{ZCD}$ is the inductor voltage frequency indication signal, the ZCD trigger signal flimit is generated after $V_{ZCD}$ and fmax are subjected to a logical NOR operation, in this case, a descending edge of flimit serves as a valid signal in the frequency limiting procedure. In an embodiment, a pulse width of the PWM is calculated via loop control, depending on an input voltage and an output load. The principle of FIG. 8 is the same as the principle of FIG. 6 except that an ascending edge is adjusted to a descending edge, and details will not be descried herein again.

In summary, according to the frequency limiting unit provided in this embodiment, the pulse signal of the preset threshold frequency of the PWM control signal generation unit and the inductor voltage frequency indication signal transmitted by the signal selection unit are subjected to a logical operation, and the result is transmitted to the PWM control signal generation unit as the ZCD trigger signal, the pulse signal of preset threshold frequency prevents the signal reversal of $V_{ZCD}$ caused by changes of the inductor voltage from taking effect on the PWM controller, that is, as described above, the ascending edges of $V_{ZCD}$ during the time period [$t_3$-$t_4$] and the time period [$t_6$-$t_7$] are invalid, during which the ZCD trigger signal flimit is not inverted, maintaining the high voltage level. Further, the control circuit in this embodiment performs the frequency limiting function based on an analog circuit, thus the signal processing procedure is simplified, the delay in the output control signal is reduced, and the requirement on performance of the processor is reduced, compared with the prior art where the frequency limiting function is performed by a processor. The requirement of controlling of the entire PFC system is met due to improved accuracy of the signal processing in the PFC system.

Figure 9:
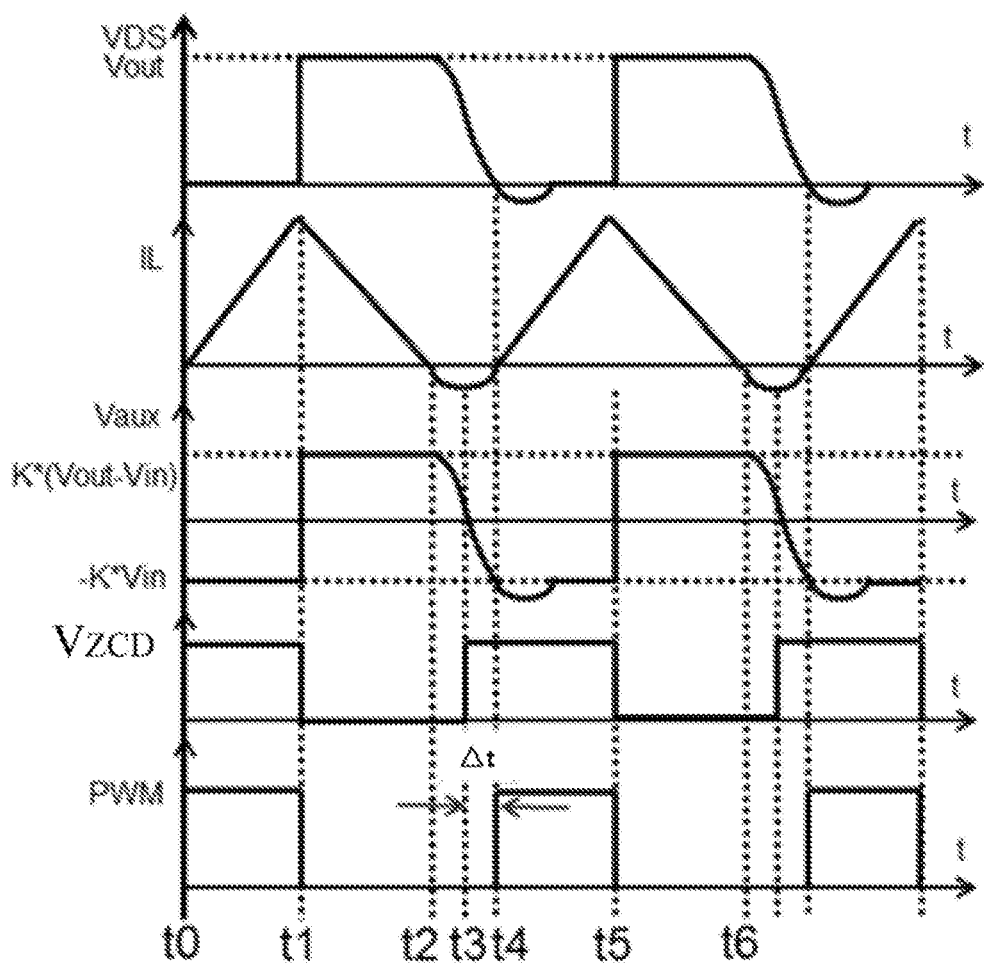
FIG. 9 is a schematic diagram illustrating timing of signals of a frequency limiting unit according to the present disclosure.
Figure 10:
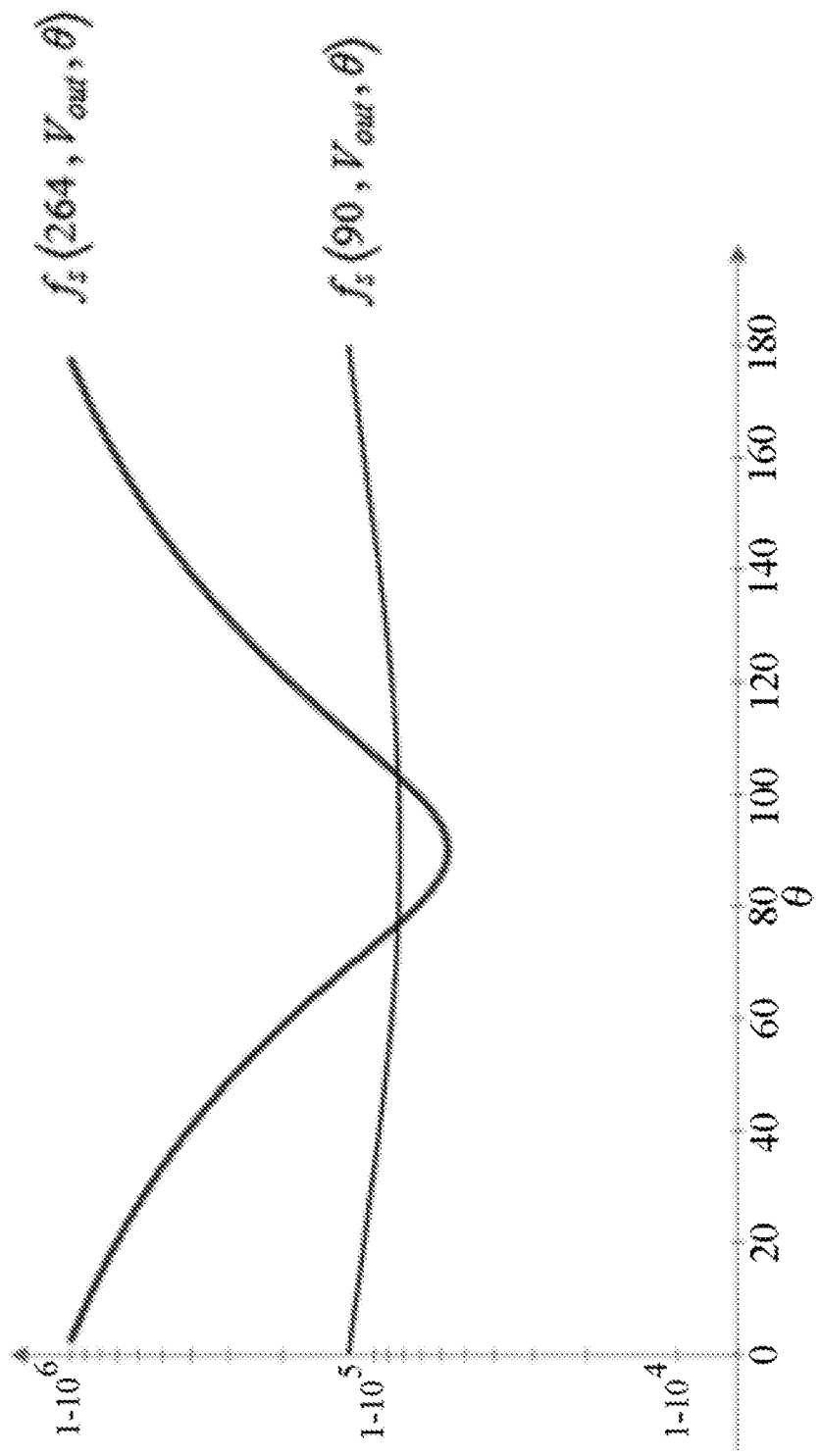
FIG. 10 is a schematic diagram of a relationship between angle and operating frequency during a half sine cycle of mains frequency according to the present disclosure.

Further, FIG. 9 and FIG. 10 illustrate a necessity of frequency limiting for the ZCD trigger signal in this embodiment. FIG. 9 is a schematic diagram illustrating timing of signals of a frequency limiting unit according to the present disclosure; FIG. 10 is a schematic diagram of a relationship between angle and operating frequency during a half sine cycle of mains frequency according to the present disclosure.

Specifically, FIG. 9 shows timing of signals of a PFC working under a DCMB operating condition. During the period from $t_2$ to $t_4$, there is an oscillation between the inductor and parasitic capacitors of the switches, thus the voltage of the inductor and the voltage across the switches oscillate. Therefore, according to the relationship between the voltage of the inductor and the voltage VDS across the switches, using the ZCD trigger signal as a determining signal, the moment when VDS oscillates to zero (or the lowest voltage) can be identified and the PWM control signal can be accordingly generated. With this method, it is ensured that, when the voltage VDS is zero, i.e. at the time $t_4$, the PWM control signal is output such that the switches Q1 and Q2 as shown in FIG. 1B and FIG. 1C are turned on. Therefore, for the PFC working in DCMB mode, the ZCD trigger signal can make sure that the power switch is turned on at zero voltage.

FIG. 10 is a diagram showing a relationship between angle and operating frequency during a half sine cycle of mains frequency of the input voltage Vac under a DCMB condition. The operating frequency is also related to input voltage and output voltage. As shown in FIGS. 10, 264 and 90 represent different effective value of input voltage. For the PFC working in DCMB mode, a high operating frequency is required in a vicinity of zero voltage crossing points, i.e. 0 degree and 180 degrees of the input Vac, in particular, the frequency will reach MHz for a high voltage application. Meanwhile, since there is not much energy transferred in the vicinity of the zero voltage crossing points, the high frequency will lead to considerable switching loss. Therefore, it is necessary to limit the frequency of the ZCD trigger signal so as to limit the high frequency switching loss at the zero voltage crossing points of the input Vac.

Figure 11:
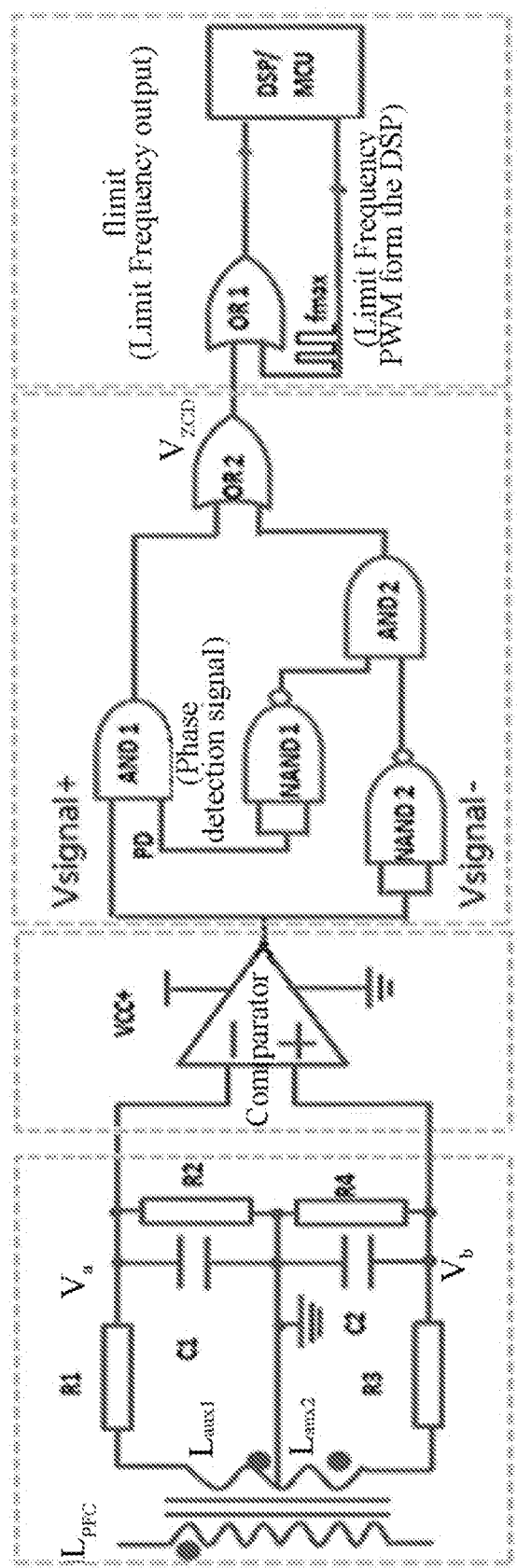
FIG. 11 is a schematic structural diagram of a control circuit according to a third embodiment of the present disclosure.

FIG. 11 is a schematic structural diagram of a control circuit according to a third embodiment of the present disclosure. The third embodiment of the control circuit as shown in FIG. 11 is a specific circuit implementation based on the first embodiment. Voltages Va and Vb on two auxiliary windings Laux1 and Laux2 are detected during the oscillation by coupling the auxiliary windings on the PFC inductor $L_{PFC}$, and zero crossing detection signal (Vsignal+ or Vsignal−) is generated via the comparator. Since the detected wave on the auxiliary windings during the positive and negative mains frequency half cycle are reverse, it is necessary to select the Vsignal+ signal which is valid during the positive half cycle and the Vsignal− signal which is valid during the negative half cycle, and it is necessary to perform logical operations for Vsignal+, Vsignal− and the phase signal PD (the Vac phase detection signal) with the signal selection unit to generate a correct and effective inductor voltage frequency indication signal $V_{ZCD}$.

Specifically, as shown in FIG. 11, the signal detection unit includes: a first winding Laux1, a second winding Laux2, a first resistor R1, a second resistor R2, a third resistor R3, a fourth resistor R4, a first capacitor C1 and a second capacitor C2. The ZDC signal acquisition unit includes a comparator.

The first winding Laux1 and the second winding Laux2 are coupled with an inductor $L_{PFC}$ at an input of the PFC circuit and configured to obtain a voltage of an input AC of the PFC circuit via a voltage of the inductor; a first end of the first winding Laux1 is connected to a first end of the first resistor R1, a second end of the first resistor R1 is connected to a first end of the second resistor R2, a first end of the first capacitor C1 and a negative input of the comparator; a second end of the first winding Laux1 is connected to a first end of the second winding Laux2, a second end of the first capacitor C1, a first end of the second capacitor C2, a second end of the second resistor R2 and a first end of the fourth resistor R4; a second end of the second winding Laux2 is connected to a first end of the third resistor R3; and a second end of the third resistor R3 is connected to a second end of the second capacitor C2, a second end of the fourth resistor R4 and a positive input of the comparator; an output of the comparator outputs the zero-crossing detection signal to the signal selection unit.

The signal selection unit includes: a first logical AND gate operator AND1, a first logical NAND gate operator NAND1, a second logical NAND gate operator NAND2, a second logical AND gate operator AND2, and a second logical OR gate operator OR2. A first input of the first logical AND gate operator AND1, and a first input and a second input of the second logical NAND gate operator NAND2 receive the zero-crossing detection signal; a second input of the first logical AND gate operator AND1, and a first input and a second input of the first logical NAND gate operator NAND1 receive a phase reference signal for the AC voltage; an output of the first logical NAND gate operator NAND1 and an output of the second logical NAND gate operator NAND2 are connected to a first input and a second input of the second logical AND gate operator AND2, respectively; an output of the first logical AND gate operator AND1 and an output of the second logical AND gate operator AND2 are connected to a first input and a second input of the second logical OR gate operator OR2, respectively; an output of the second logical OR gate operator OR2 outputs the inductor voltage frequency indication signal $V_{ZCD}$ to the frequency limiting unit. It should be noted that the first logical NAND gate operator and the second logical NAND gate operator may also be a first logical NOT gate operator and a second logical NOT gate operator.

The frequency limiting unit includes the first logical OR gate operator OR1. The two inputs of the first logical OR gate operator receive the pulse signal fmax of the preset threshold frequency and the inductor voltage frequency indication signal $V_{ZCD}$, respectively; the first logical OR gate operator OR1 performs an OR operation for the pulse signal of the preset threshold frequency and the inductor voltage frequency indication signal; and the first logical OR gate operator OR1 outputs the ZCD trigger signal to the PWM control signal generation unit. The PWM control signal generation unit is a digital processor DSP/MCU.

Figure 12B:
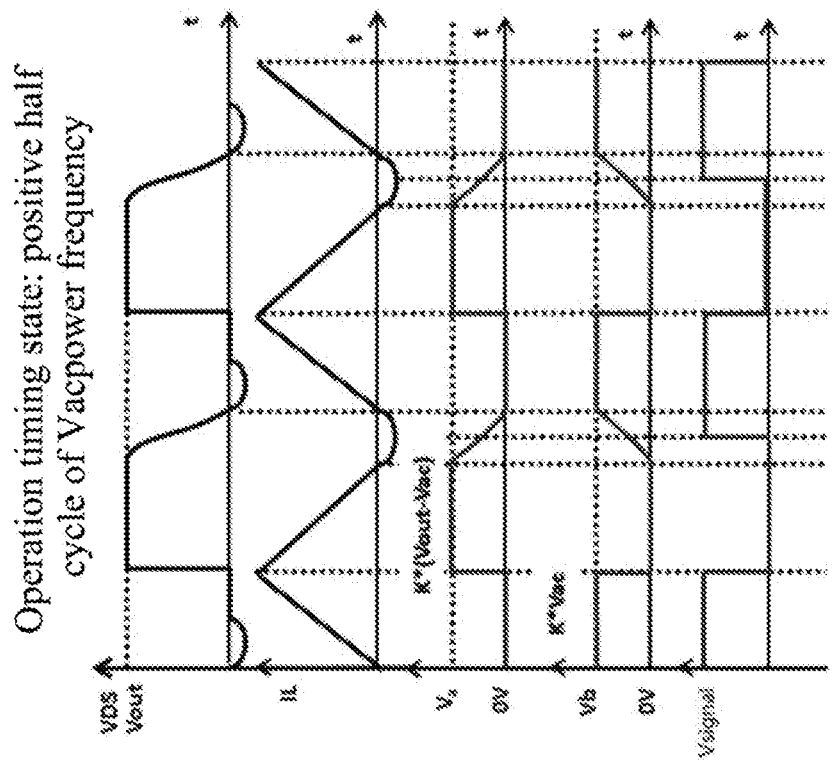
FIG. 12A and FIG. 12B show a schematic diagram illustrating timing of an inductor voltage detection signal and a zero-crossing detection signal of a control circuit according to a third embodiment of the present disclosure.
Figure 12A:
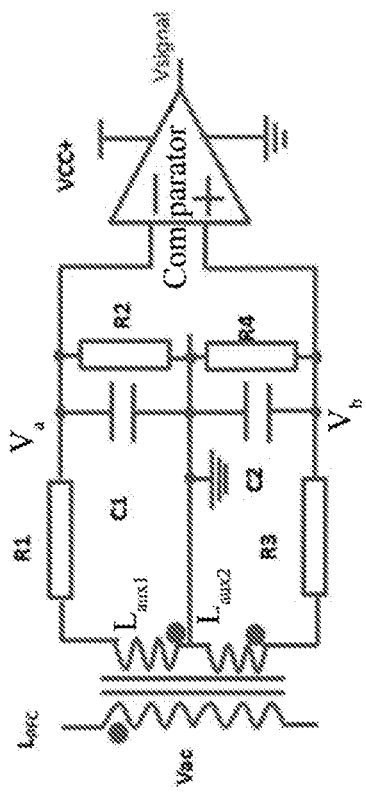

Further, FIG. 12A and FIG. 12B show a schematic diagram illustrating timing of an inductor voltage detection signal and a zero-crossing detection signal of a control circuit according to a third embodiment of the present disclosure. As shown in FIG. 12A and FIG. 12B, since the comparator actually uses VCC as a single power supply, Va and Vb in the operation timing diagram are operating voltages that can be identified by the comparator, and the minimum voltage is zero voltage. In a case where the positive input Vac is during the positive half cycle of the mains frequency, when the inductor current IL decreases, Va is K*(Vout−Vac) (K is a proportional coefficient of the auxiliary winding) and Vb is zero voltage; when the inductor current is oscillated from zero to negativity, Va will drop from K*(Vout−Vac) to zero voltage and Vb will rise from zero voltage to K*Vac. In this process, the zero-crossing detection signal Vsignal+ is obtained by comparing the voltage changes of Va and Vb. For the negative half cycle of the mains frequency, the obtaining of the zero-crossing detection signal is opposite to that during the positive half cycle of the mains frequency.

Figure 13B:
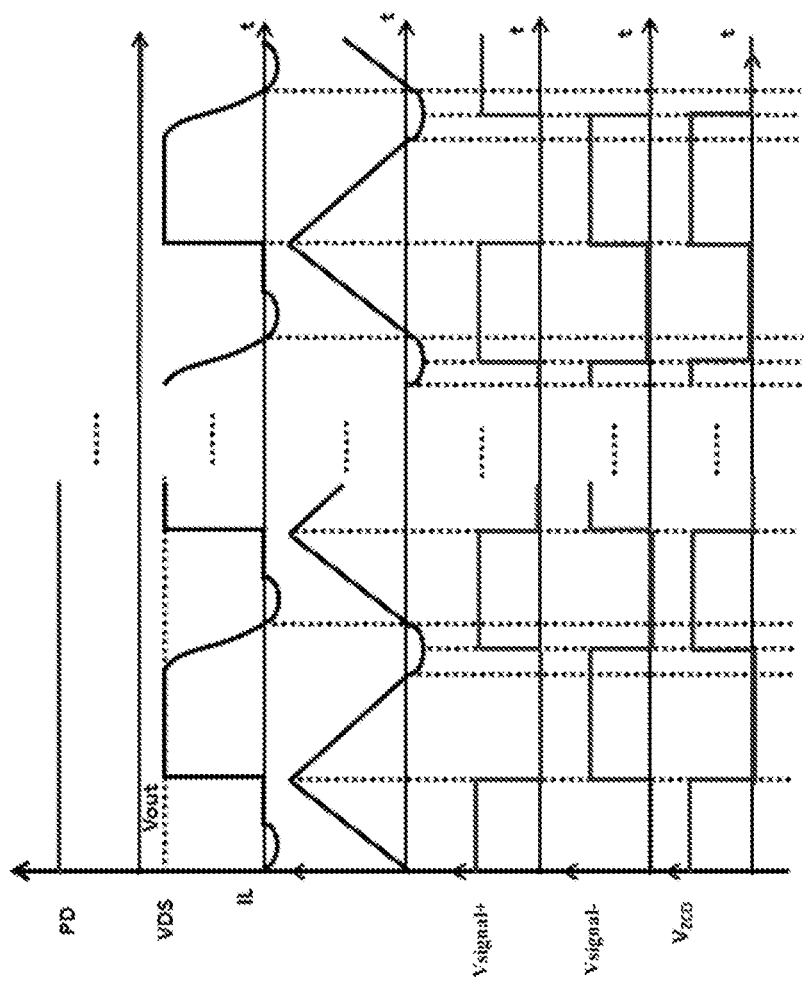
FIG. 13A and FIG. 13B show a schematic diagram illustrating timing of an inductor voltage frequency indication signal of a control circuit according to a third embodiment of the present disclosure.
Figure 13A:
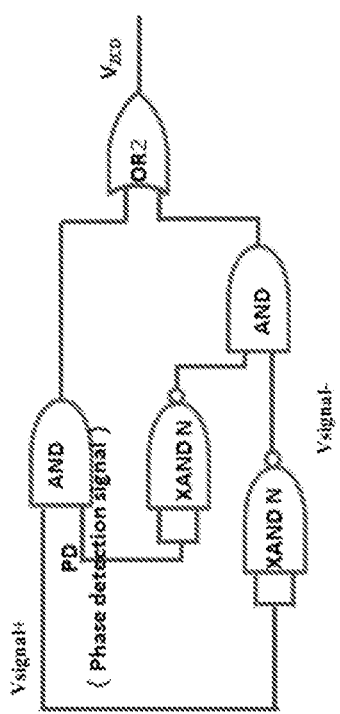

FIG. 13A and FIG. 13B show a schematic diagram illustrating timing of an inductor voltage frequency indication signal of a control circuit according to a third embodiment of the present disclosure. In this embodiment, two intermediate signals are obtained according to the zero-crossing detection signal, which are respectively a positive zero-crossing detection signal Vsignal+ and a negative zero-crossing detection signal Vsignal−. The positive zero-crossing detection signal Vsignal+ is the zero-crossing detection signal, and the negative zero-crossing detection signal Vsignal− is an output signal after the zero-crossing detection signal is subjected to the NAND gate operation. When the phase signal PD is at high voltage level, the positive zero-crossing detection signal Vsignal+ and the PD are subjected to a logical AND operation to output Vsignal+; the signal Vsignal− and the flipped value of PD are subjected to an AND operation to output a low-level signal; finally, the Vsignal+ signal and the low level signal are subjected to a logical OR operation to output the $V_{ZCD}$ signal, which is the signal Vsignal+. When the phase signal PD is at low voltage level, Vsignal+ and PD are subjected to a logical AND operation to output low voltage level signal; the signal Vsignal− and the flipped value of PD are subjected to an AND operation to output Vsignal−; finally, the Vsignal− signal and the low-level signal are subjected to a logical OR operation to output the $V_{ZCD}$ signal, which is the signal Vsignal−. Therefore, for the detected signals of different phases, corresponding signals may be individually extracted by the signal selection unit to obtain the inductor voltage frequency indication signal.

Figure 14B:
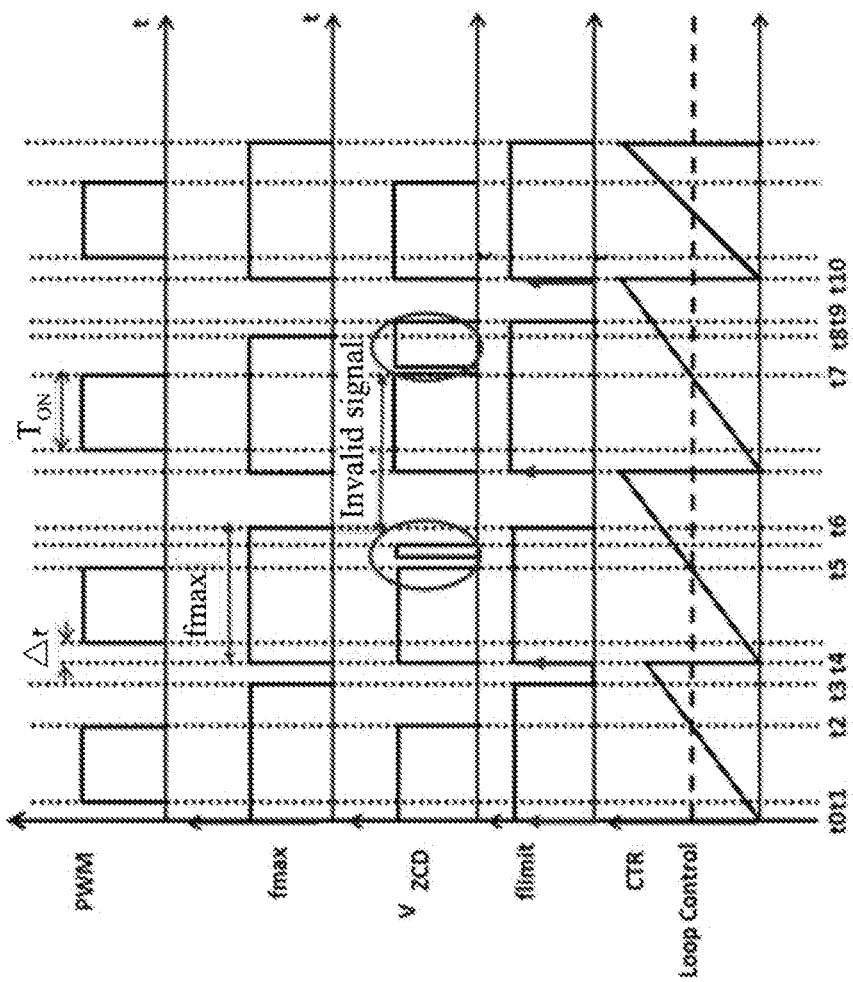
FIG. 14A and FIG. 14B show a schematic diagram illustrating timing of a ZCD trigger signal of a control circuit according to a third embodiment of the present disclosure.
Figure 14A:
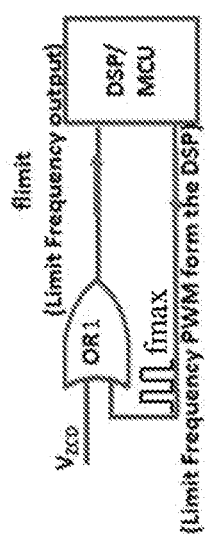

FIG. 14A and FIG. 14B show a schematic diagram illustrating timing of a ZCD trigger signal of a control circuit according to a third embodiment of the present disclosure. As shown in FIG. 14, at the time $t_0$, both of the inductor voltage frequency indication signal $V_{ZCD}$ and the pulse signal of the preset threshold frequency fmax are at high voltage levels, $V_{ZCD}$ and fmax are subjected to an OR operation to produce an ascending edge of flimit, the DSP identifies the ascending edge of the ZCD trigger signal flimit, then CTR is cleared to restart counting; a period from $t_0$ to $t_1$ is dead time for the PWM, during which VDS of the switch is oscillated to zero; during a period from $t_1$ to $t_2$, the PWM signal is output to control turn-on time Ton of the switches; at the time $t_2$, $V_{ZCD}$ is changed from high voltage level to low voltage level, but fmax maintains high voltage level, then flimit is not inverted, CTR continues counting; at the time $t_3$, the pulse signal fmax at the preset threshold frequency reaches the frequency-limiting time to change to low voltage level, the ZCD trigger signal and flimit are inverted simultaneously, and CTR continues counting; at the time $t_4$, both $V_{ZCD}$ and fmax rises to high voltage levels, an ascending edge of flimit is produced again, and CTR is cleared to restart counting; during a period from $t_5$ to $t_6$, the voltage level of $V_{ZCD}$ changes, yet fmax remains at high voltage level during this period, flimit remains unchanged, and CTR continues counting; similarly, during a period from $t_7$ to $t_8$, the level changing of $V_{ZCD}$ is invalid; at the time $t_8$, fmax is inverted to low voltage level, however, yet $V_{ZCD}$ is at high voltage level, flimit remains unchanged, and CTR continues counting until the time $t_9$ when $V_{ZCD}$ changes to low voltage level, and flimit is then inverted.

In an embodiment, the zero-crossing detection signal as shown in the above embodiment includes a phase signal of the voltage Vac. Correspondingly, the zero-crossing detection signal may also include: a voltage signal during positive half cycle of and a voltage signal during negative half cycle of the voltage. Adjustments need to be made to circuit structures of the signal detection unit, the ZCD signal acquisition unit, and the signal selection unit, respectively.

Figure 15:
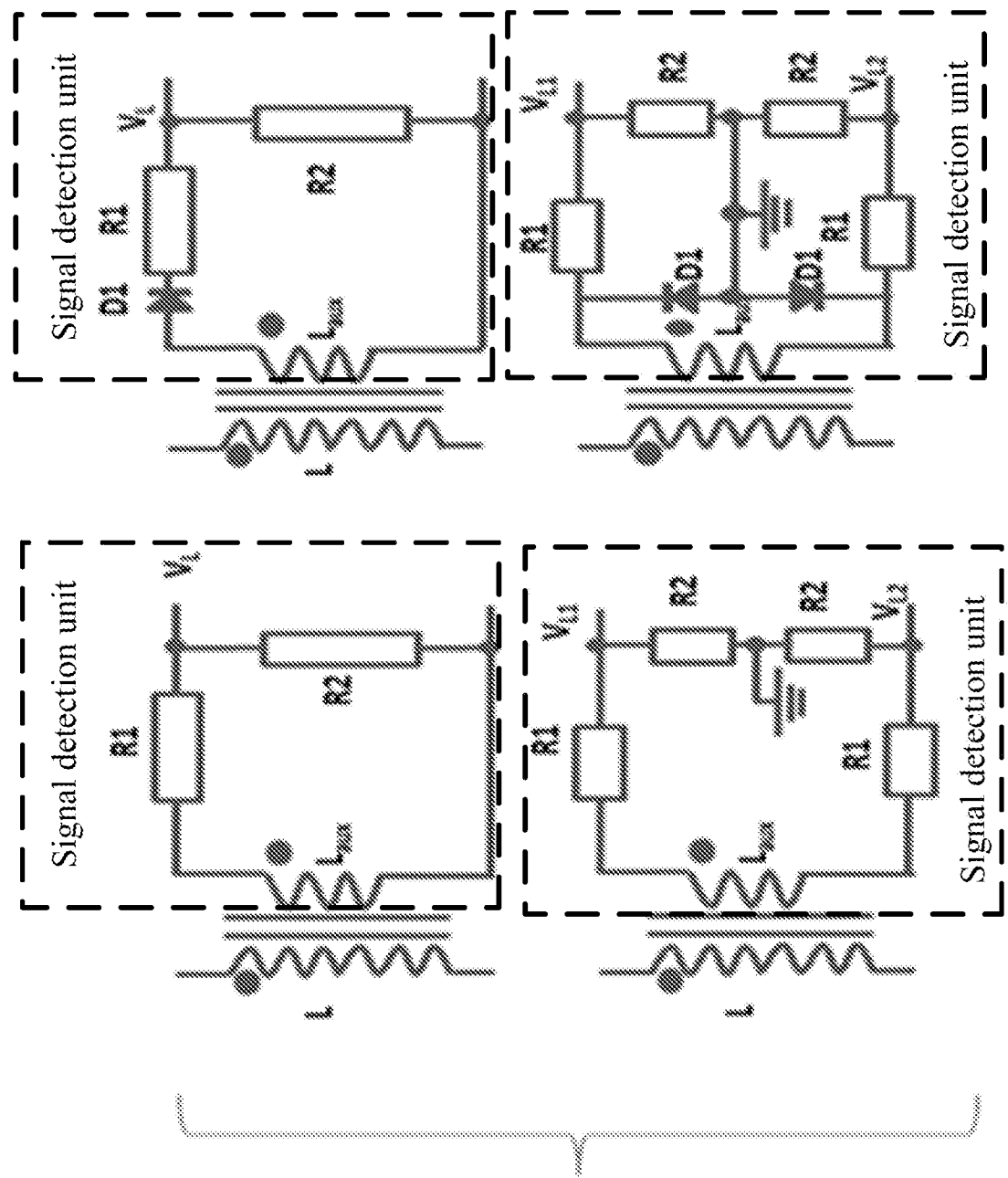
FIG. 15 is a schematic structural diagram of a signal detection unit according to a first embodiment of the present disclosure.
Figure 16:
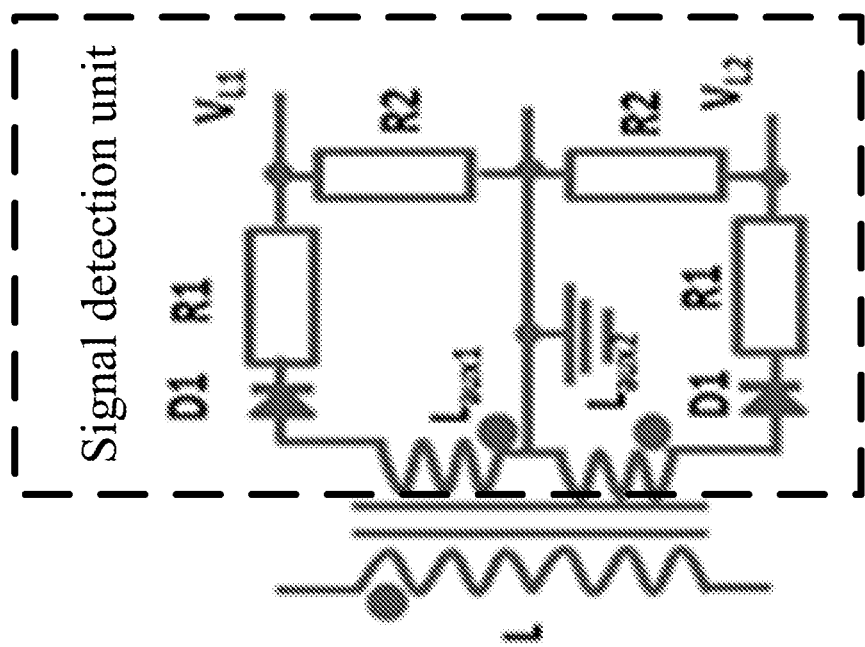
FIG. 16 is a schematic structural diagram of a signal detection unit according to a second embodiment of the present disclosure.
Figure 16:
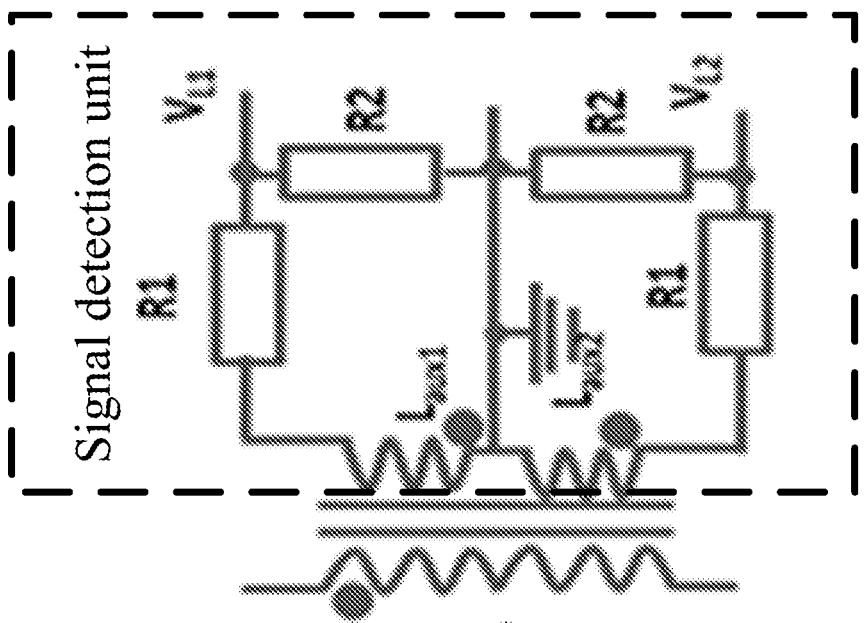
Figure 16:
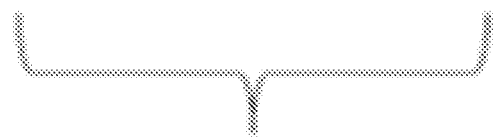
Figure 17:
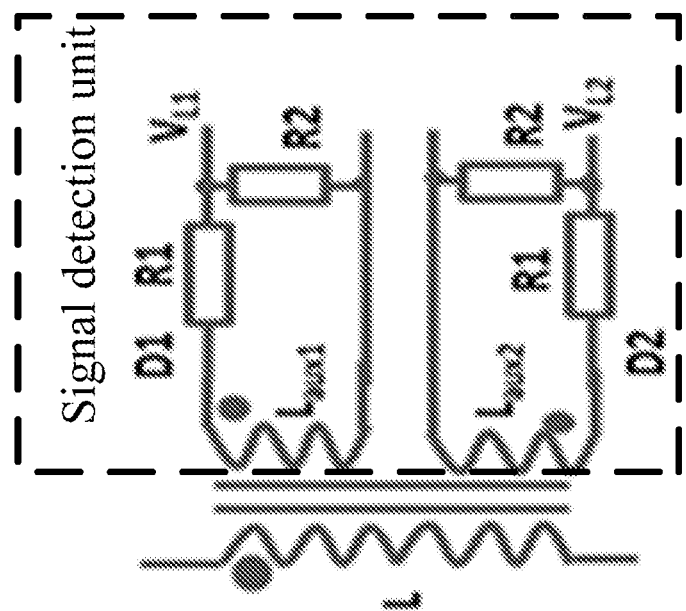
FIG. 17 is a schematic structural diagram of a signal detection unit according to a third embodiment of the present disclosure.
Figure 17:
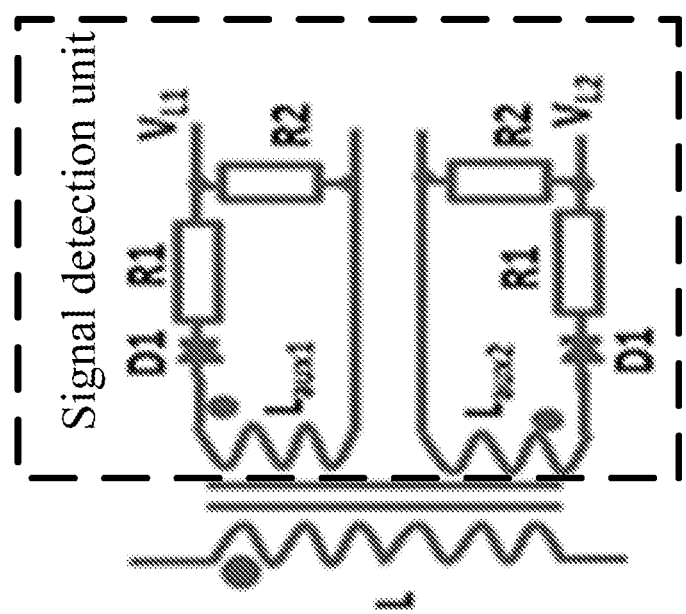

For instance, dashed boxes in FIG. 15-FIG. 17 show schematic structural diagrams of various embodiments of a signal detection unit. FIG. 15 is a schematic structural diagram of a signal detection unit according to a first embodiment of the present disclosure, where an inductor voltage is detected using a single auxiliary winding; FIG. 16 is a schematic structural diagram of a signal detection unit according to a second embodiment of the present disclosure, where an inductor voltage is detected using a center-tapped auxiliary winding; FIG. 17 is a schematic structural diagram of a signal detection unit according to a third embodiment of the present disclosure, where an inductor voltage is detected using two auxiliary winding. The signal detection unit in embodiments of the present disclosure may be replaced with a circuit structure and an implementation as shown in FIG. 15 to FIG. 17 or as known to persons skilled in the art, and details will not be described herein again.

Figure 18:
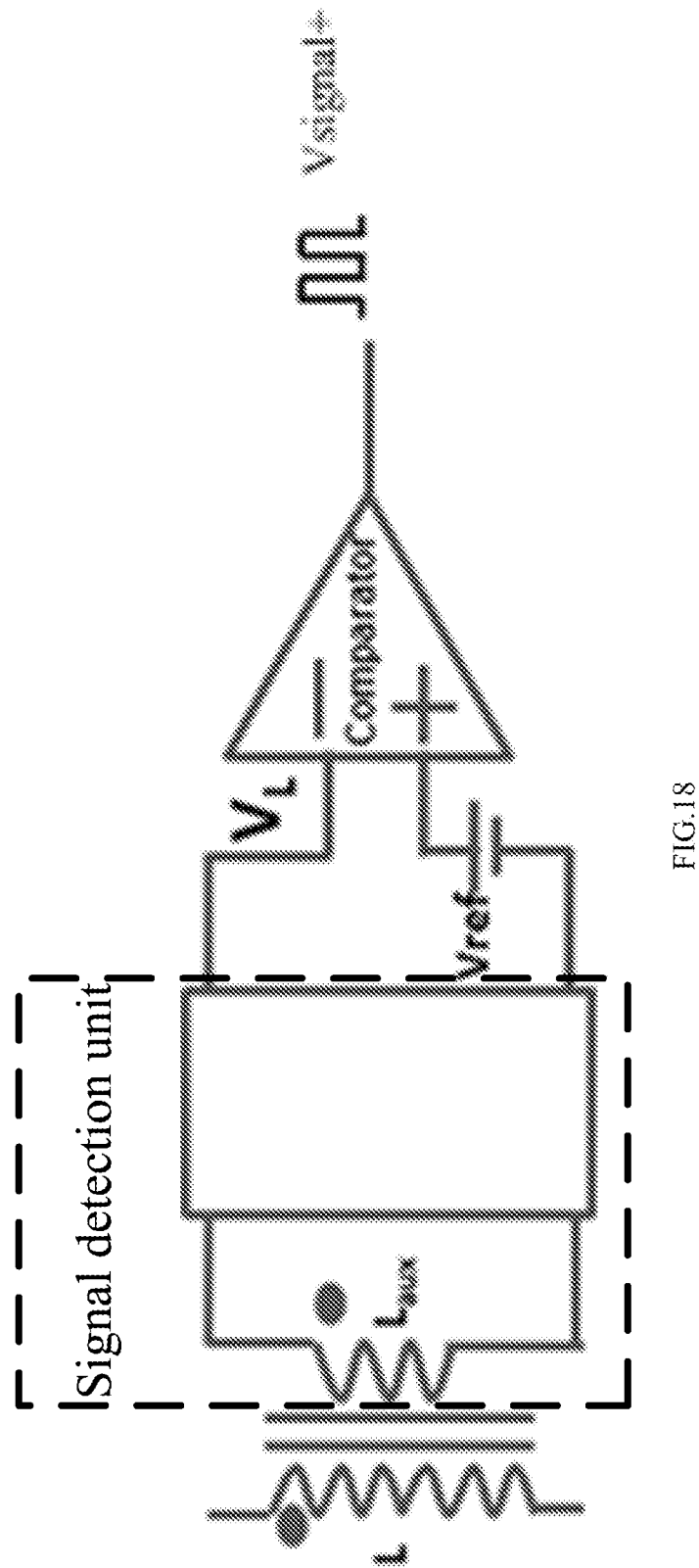
FIG. 18 is a schematic structural diagram of a ZCD signal acquisition unit according to a first embodiment of the present disclosure.
Figure 19:
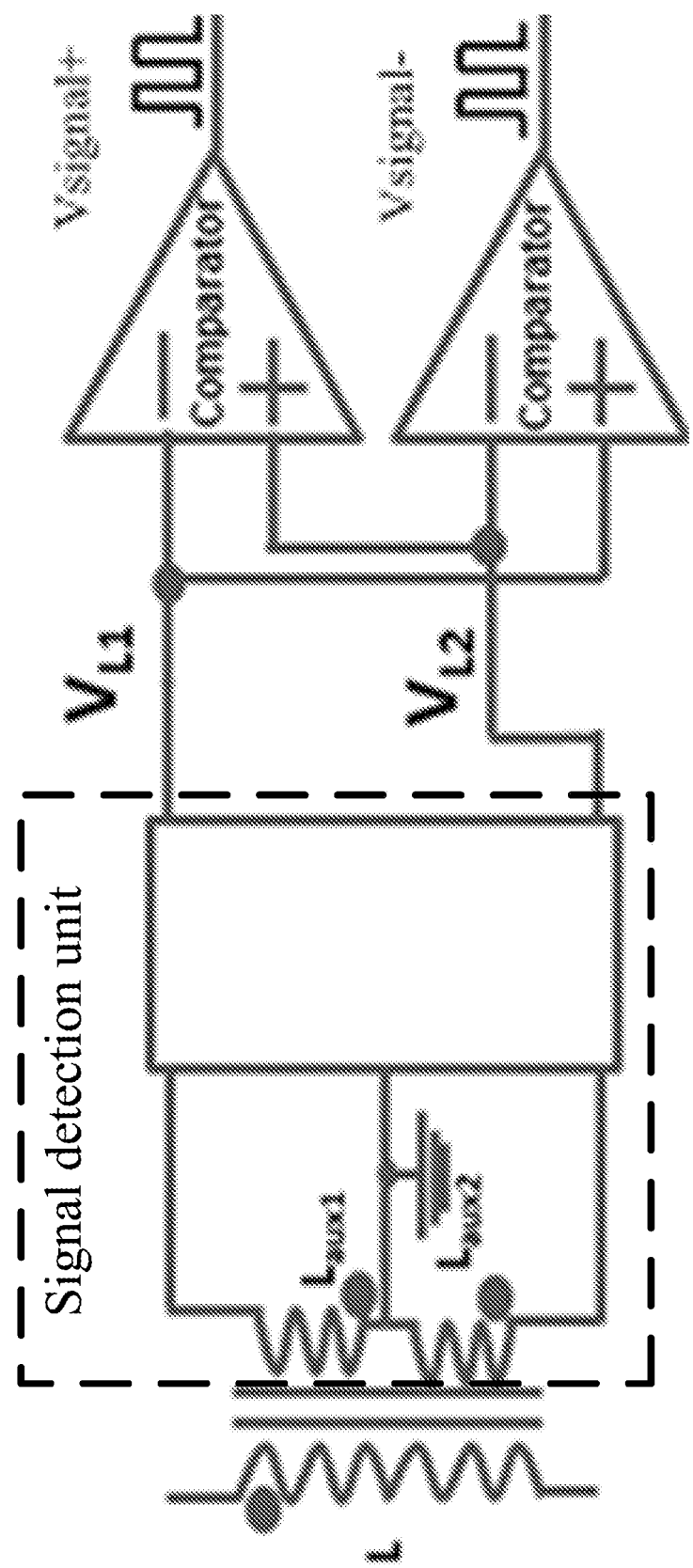
FIG. 19 is a schematic structural diagram of a ZCD signal acquisition unit according to a second embodiment of the present disclosure.
Figure 20:
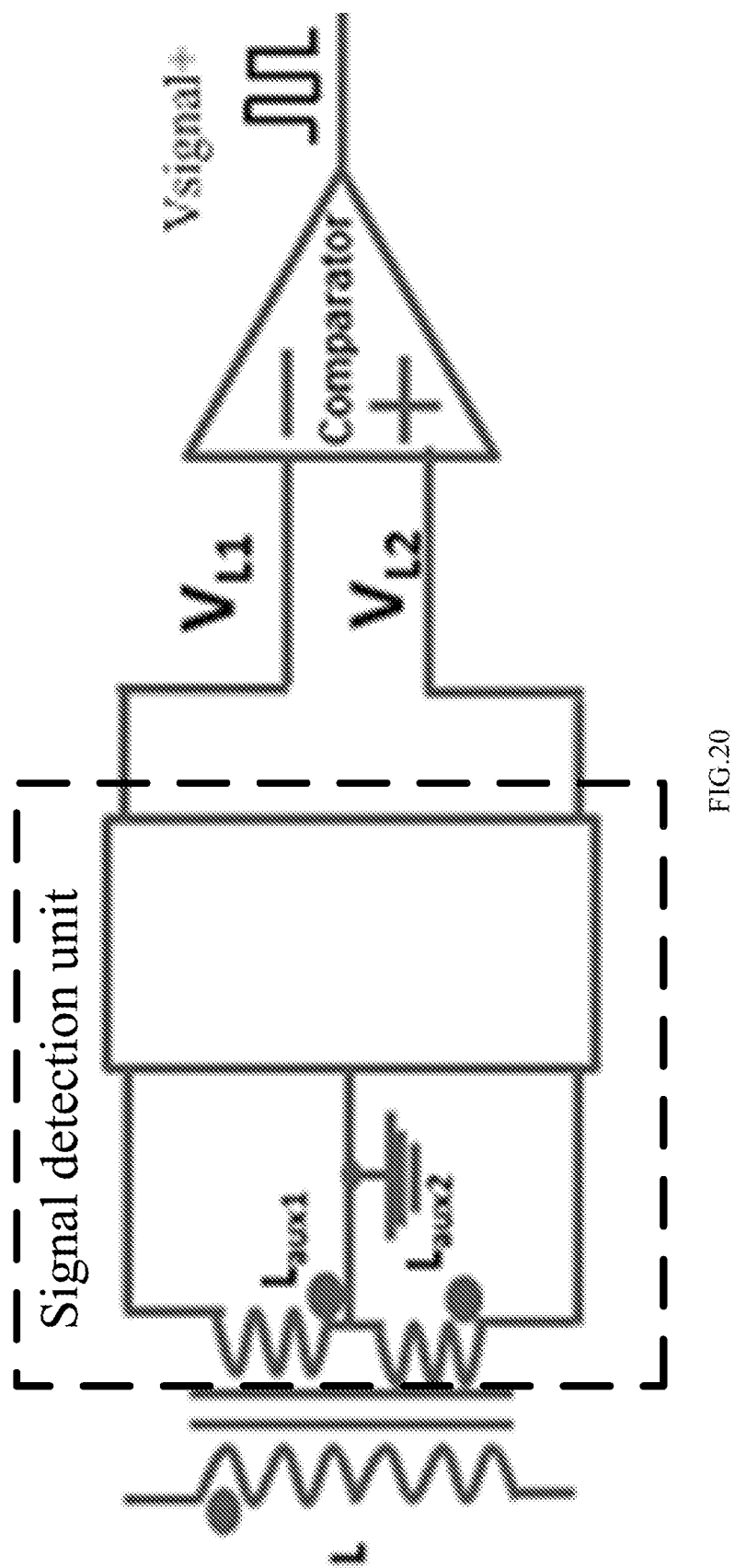
FIG. 20 is a schematic structural diagram of a ZCD signal acquisition unit according to a third embodiment of the present disclosure.
Figure 21:
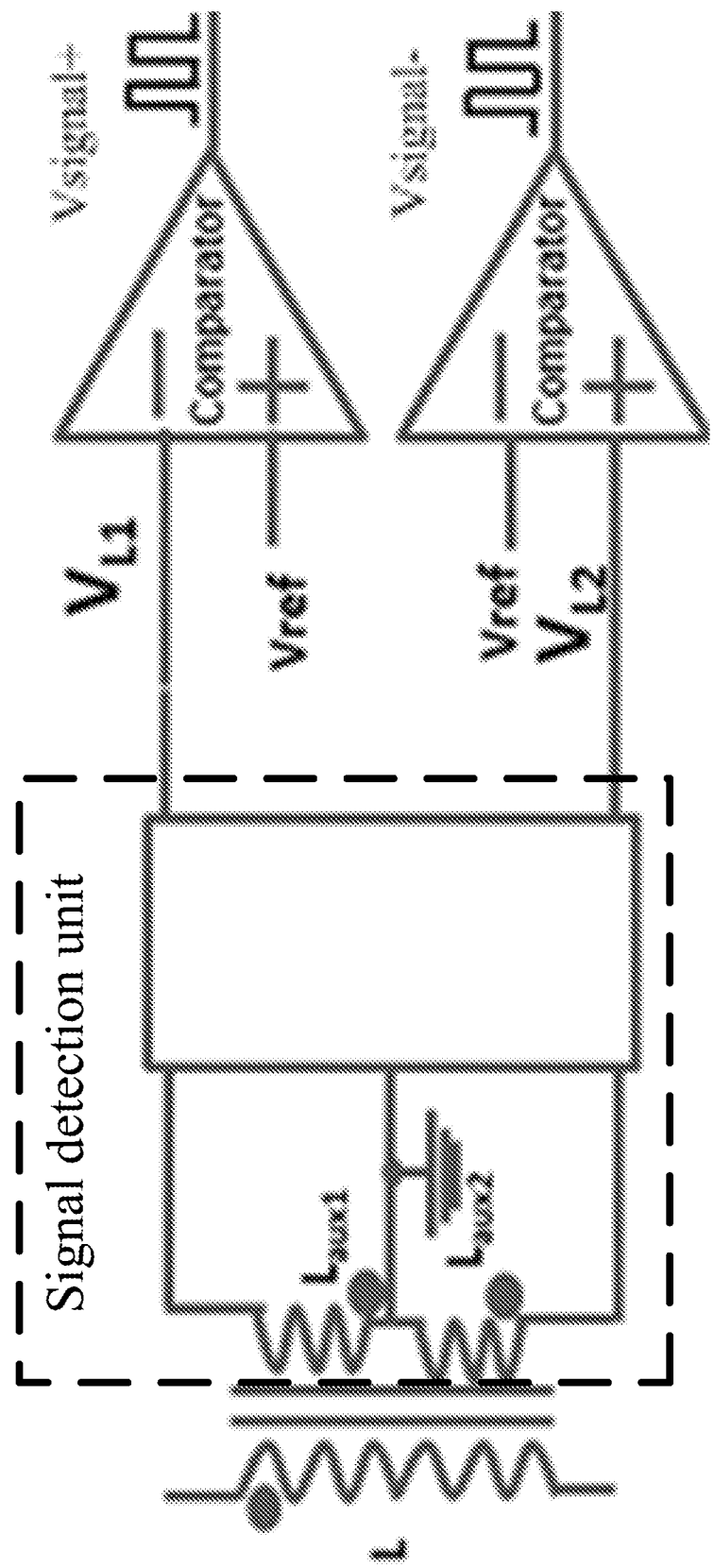
FIG. 21 is a schematic structural diagram of a ZCD signal acquisition unit according to a fourth embodiment of the present disclosure.

FIG. 18 to FIG. 21 below show structural diagrams of embodiments of the ZCD signal acquisition unit, where dash boxes show the signal detection unit. Moreover, for a specific structure of the signal detection unit, only auxiliary windings are shown, while remaining portions are replaced with blank boxes. For a specific structure of one of the blank boxes, reference may be made to, for example, structures shown in FIG. 18 to FIG. 21. FIG. 18 is a schematic structural diagram of a ZCD signal acquisition unit according to a first embodiment of the present disclosure, applicable in a case where input voltage only comprises positive half-wave or negative half-wave. A zero-crossing detection signal is directly output through a comparison of an inductor voltage detection signal VL obtained by the signal detection unit with a threshold Vref (Vref is a reference voltage value when the inductor current is zero) of the comparator; FIG. 19 is a schematic structural diagram of a ZCD signal acquisition unit according to a second embodiment of the present disclosure; FIG. 20 is a schematic structural diagram of a ZCD signal acquisition unit according to a third embodiment of the present disclosure; and FIG. 21 is a schematic structural diagram of a ZCD signal acquisition unit according to a fourth embodiment of the present disclosure. FIG. 19-FIG. 21 are applied in a case where the input voltage comprises both positive half-wave and negative half-wave. In FIG. 19, inductor voltage detection signals VL1 and VL2 obtained by the signal detection unit are input to two comparators, where VL1 and VL2 are comparison thresholds for each other, and two zero-crossing detection signals Vsignal+ and Vsignal− are output to the signal selection unit finally; in FIG. 20, inductor voltage detection signals VL1 and VL2 obtained by the signal detection unit are input to one comparator, where VL1 and VL2 are comparison thresholds for each other, and only one zero-crossing detection signal Vsignal+ is output to the signal selection unit finally; in FIG. 21, inductor voltage detection signals VL1 and VL2 obtained by the signal detection unit are input to two comparators for respective comparisons with the threshold Vref of the comparators, and only two zero-crossing detection signals Vsignal+ and Vsignal− are output to the signal selection unit finally. The ZCD signal acquisition unit in embodiments of the present disclosure may be replaced with a circuit structure and an implementation as shown in FIG. 18 to FIG. 21 or as known to persons skilled in the art, and details will not be described herein again.

Figure 22:
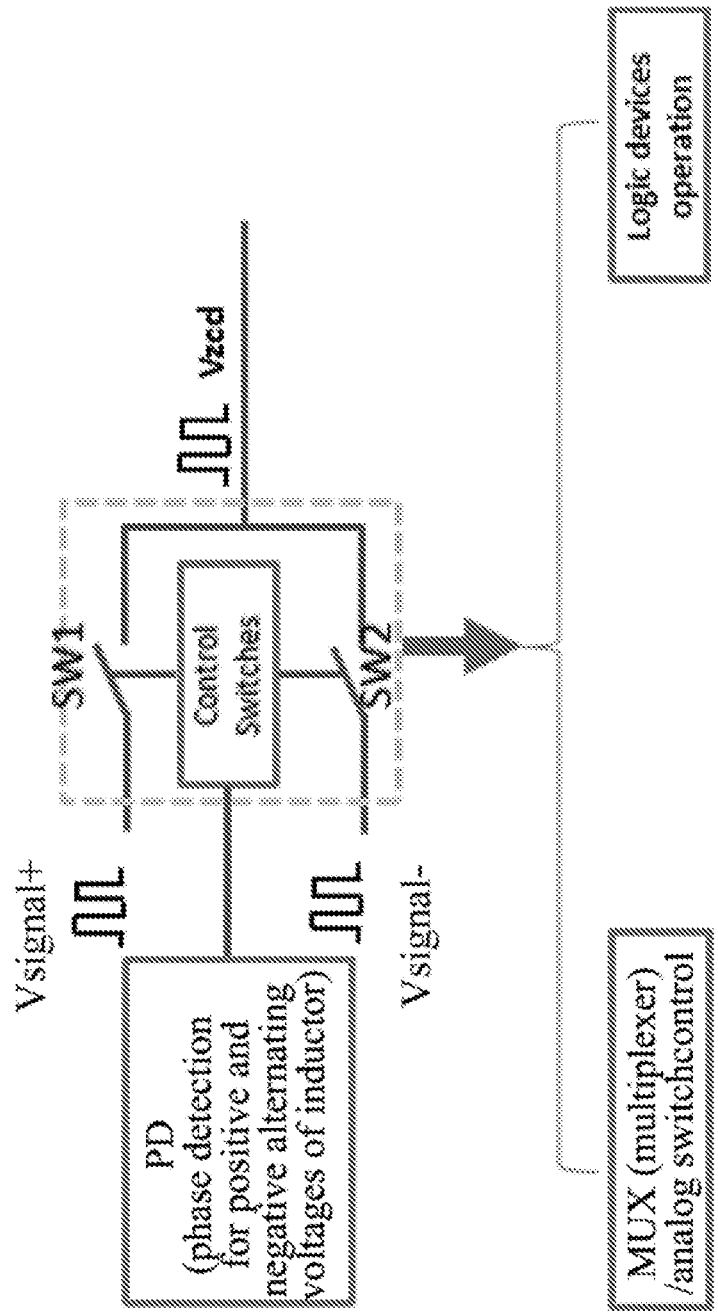
FIG. 22 is a schematic structural diagram of a signal selection unit according to a first embodiment of the present disclosure.

FIG. 22 is a schematic structural diagram of a signal selection unit according to a first embodiment of the present disclosure, which is used to obtain positive and negative zero-crossing detection signals Vsignal+ and Vsignal− when the input voltage comprises both positive half-wave and negative half-wave, where the signal selection unit may switch to the inductor voltage signal of a phase by determining the corresponding phase of the Vac voltage. For instance, when PD is at high voltage level, the Vsignal+ signal is read, SW1 is turned off and SW2 is turned on according to the PD signal, and the inductor voltage frequency indication signal $V_{ZCD}$ is the zero-crossing detection signal Vsignal+; otherwise, when PD is at low voltage level, the inductor voltage frequency indication signal $V_{ZCD}$ signal is the Vsignal−.

Figure 23:
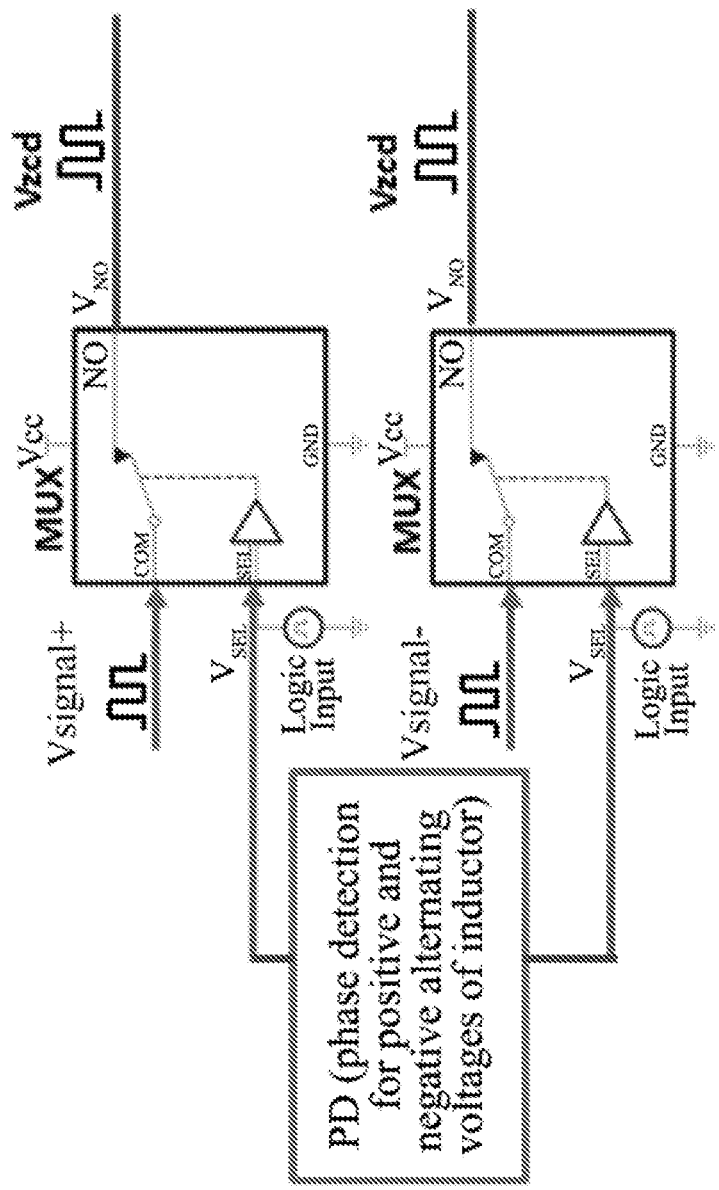
FIG. 23 is a schematic structural diagram of a signal selection unit according to a second embodiment of the present disclosure.
Figure 24:
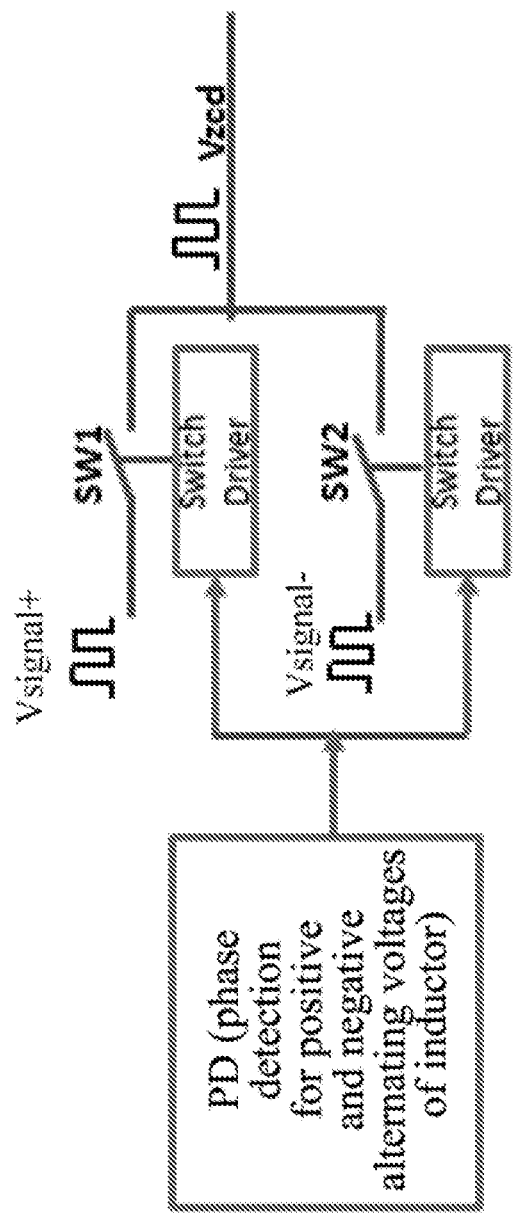
FIG. 24 is a schematic structural diagram of a signal selection unit according to a third embodiment of the present disclosure.
Figure 25:
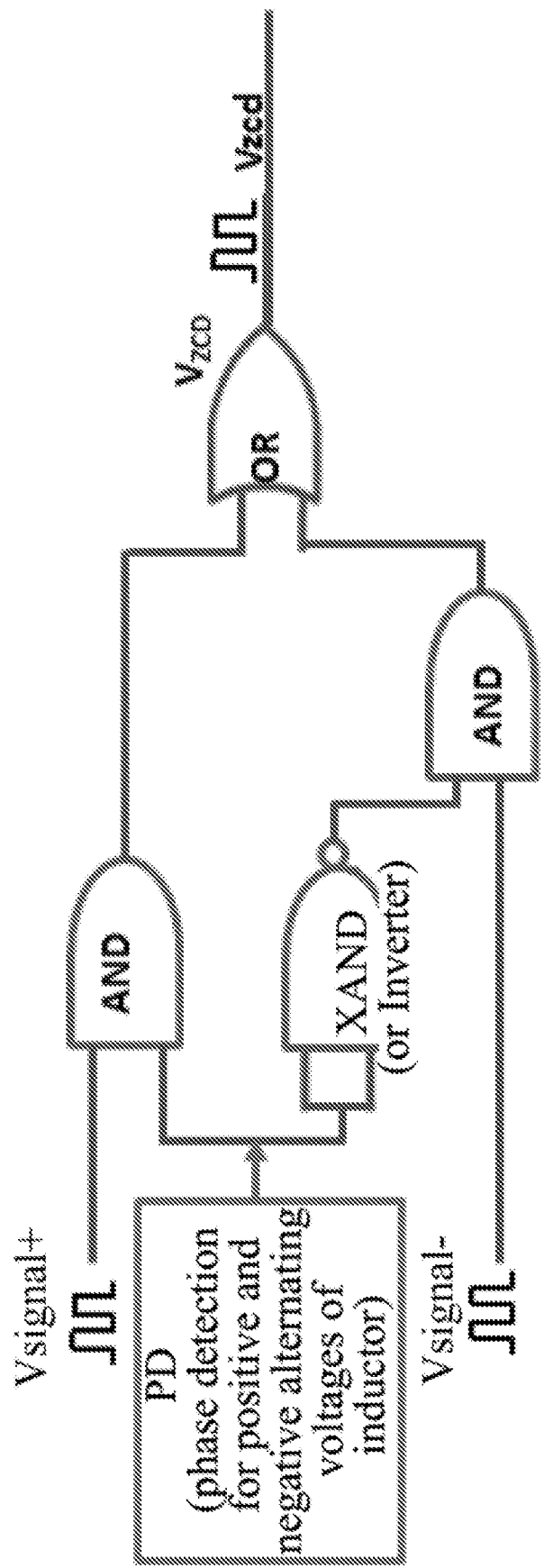
FIG. 25 is a schematic structural diagram of a signal selection unit according to a fourth embodiment of the present disclosure.

FIG. 23 is a schematic structural diagram of a signal selection unit according to a second embodiment of the present disclosure, which uses two MUXs (multiplexer) to select the zero-crossing detection signal, where the phase signal PD, controls the MUX chip selection enabling pin to determine whether or not to read the zero-crossing detection signal to obtain the $V_{ZCD}$ signal; FIG. 24 is a schematic structural diagram of a signal selection unit according to a third embodiment of the present disclosure, which uses switches (such as an MOSFET or a transistor) to perform signal selection, where the phase signal PD determines, by controlling the switch drivers, whether or not to turn on the corresponding switch to obtain the $V_{ZCD}$ signal; FIG. 25 is a schematic structural diagram of a signal selection unit according to a fourth embodiment of the present disclosure, which performs the selection of the zero-crossing detection signal with a combination of logical operators. In this embodiment, the phase signal PD and the zero-crossing detection signal Vsignal+ are subjected to an AND operation, a flipped signal of the PD and the zero-crossing detection signal Vsignal− are subjected to an AND operation, then results of the two AND operations are subjected to a logical OR operation, and inductor voltage frequency indication signals $V_{ZCD}$ corresponding to different phases may be obtained. When the phase signal PD is at high voltage level, the final result of logical operation is Vsignal+, which is also the final selected $V_{ZCD}$ signal; otherwise, when the PD is at low voltage level, Vsignal− is the final selected $V_{ZCD}$ signal. The signal selection unit in embodiments of the present disclosure may be replaced with a circuit structure and an implementation as shown in FIG. 22 to FIG. 25 or as known to persons skilled in the art, and details will not be described herein again.

Figure 26B:
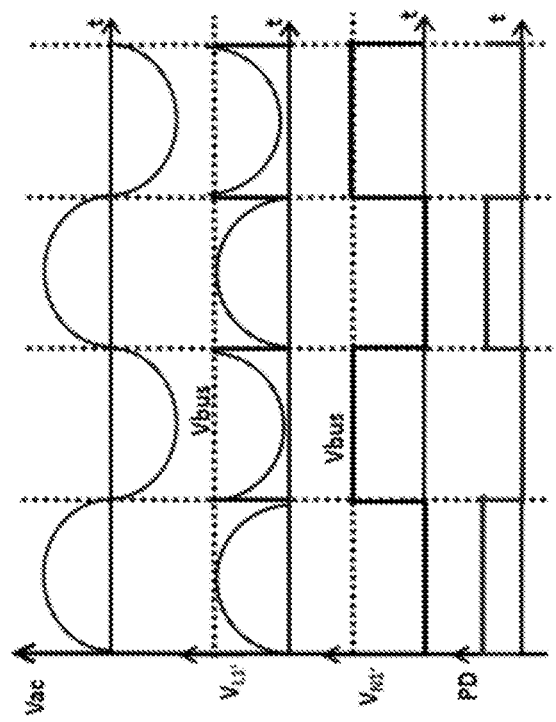
FIG. 26A and FIG. 26B show a schematic diagram illustrating a principle of acquisition of a phase signal by a signal selection unit according to a first embodiment of the present disclosure.
Figure 26A:
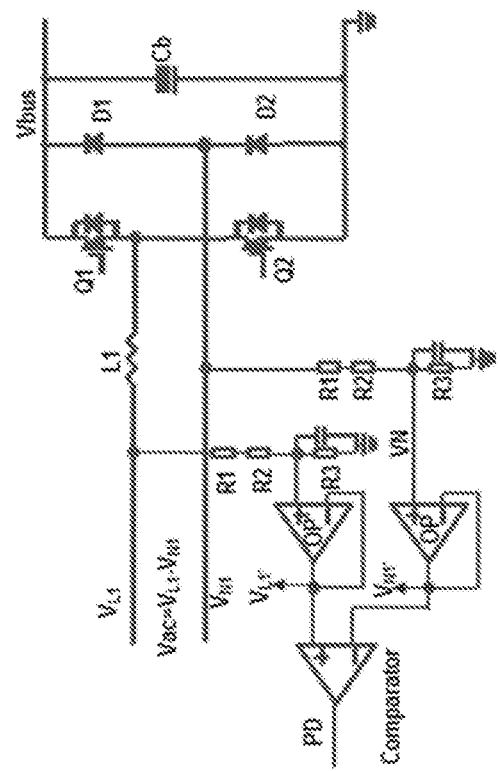
Figure 27B:
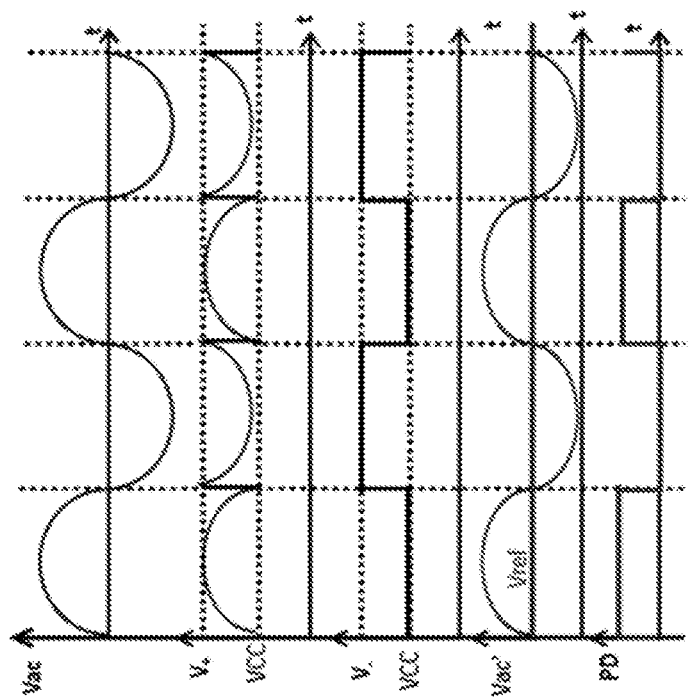
FIG. 27A and FIG. 27B show a schematic diagram illustrating a principle of acquisition of a phase signal by a signal selection unit according to a second embodiment of the present disclosure.
Figure 27A:
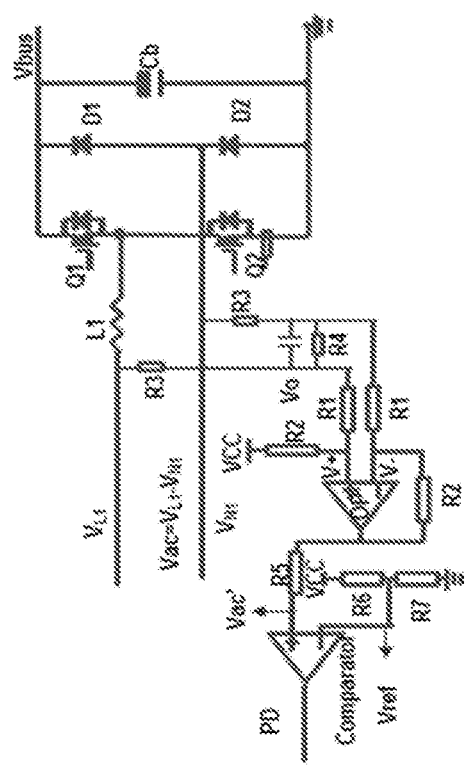

Further, in the embodiments described above, FIG. 26A and FIG. 26B show a schematic diagram illustrating a principle of acquisition of a phase signal by a signal selection unit according to a first embodiment of the present disclosure; and FIG. 27A and FIG. 27B show a schematic diagram illustrating a principle of acquisition of a phase signal by a signal selection unit according to a second embodiment of the present disclosure. In FIG. 26A and FIG. 26B, $V_{L1}$ and $V_{N1}$ of the input voltage Vac are respectively detected, $V_{L1'}$ and $V_{N1'}$ are obtained through voltage divider resistors R1, R2, and R3, and the phase signal PD is finally obtained through a comparison by the comparator. Since the detection circuit for the phase signal is applied in the Totem-pole bridgeless PFC, voltage variations of $V_{L1'}$ and $V_{N1'}$ are affected by the operating state of the bridgeless PFC. When the input Vac is positive, $V_{L1'}$ is a half sine wave and $V_{N1'}$ is zero voltage; when the input Vac is negative, $V_{L1'}$ is the sum of the negative half-cycle waveform of the input sinusoidal AC voltage Vac and the value of the DC bus voltage Vbus, and $V_{N1'}$ is the output Vbus voltage. In FIG. 27A and FIG. 27B, Vac is detected via a differential amplifier, a corresponding proportion of Vac is obtained as Vac', Vac' is then delivered to the comparator for a comparison with Vref (obtained by voltage divider R6 and R7, and adjusted to the DC component of Vac'), and finally the phase signal PD is obtained. Since the detected value is the difference between $V_{L1}$ and $V_{N1}$, the detected voltage has always been proportional to Vac regardless of the operating state of the bridgeless PFC.

Figure 28:
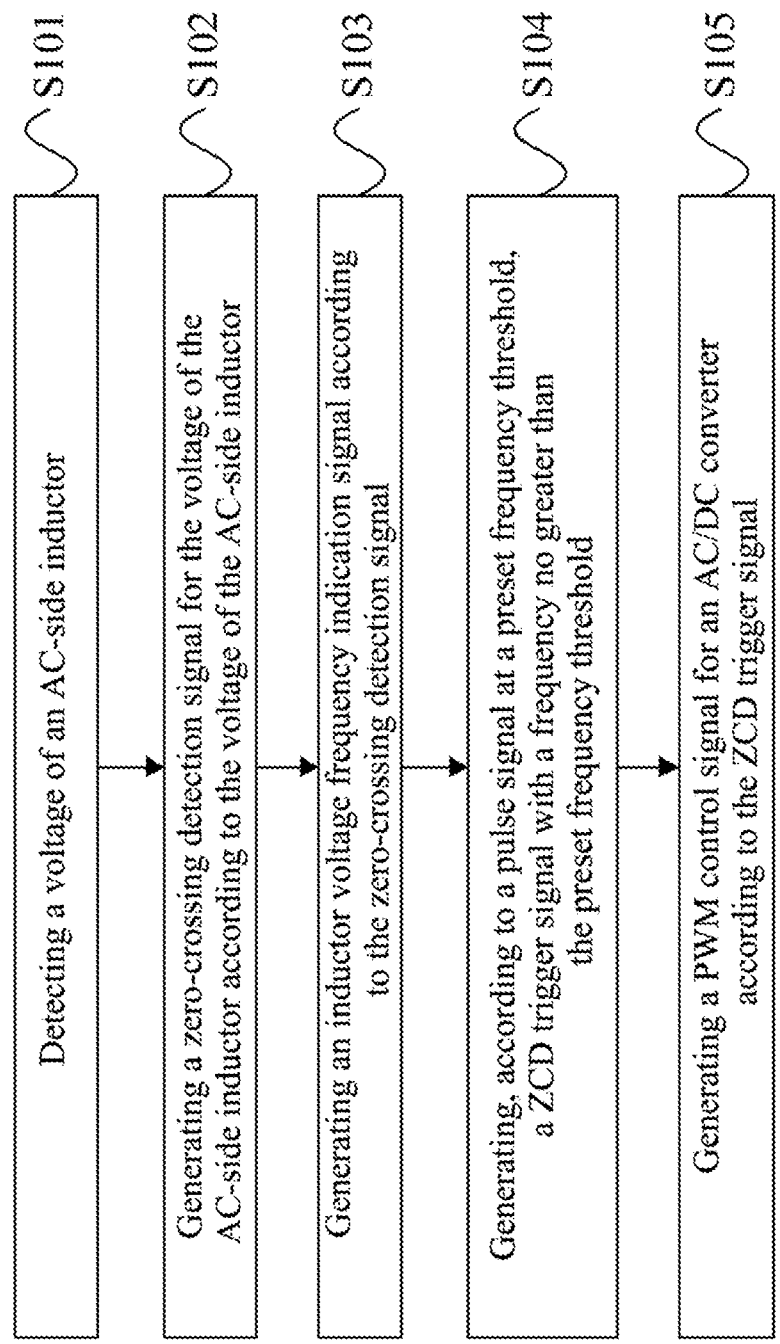
FIG. 28 is a schematic flow chart of a control method according to a first embodiment of the present disclosure.

FIG. 28 is a schematic flow chart of a control method according to a first embodiment of the present disclosure. As shown in FIG. 28, the control method according to the first embodiment of the present disclosure includes:

S101, detecting a voltage of an AC-side inductor;

S102, generating a zero-crossing detection signal according to the voltage of the AC-side inductor;

S103, generating an inductor voltage frequency indication signal according to the zero-crossing detection signal;

S104, generating, according to a pulse signal of a preset threshold frequency, a ZCD trigger signal of a frequency no greater than the preset threshold frequency; and S105, generating a PWM control signal for an AC/DC converter according to the ZCD trigger signal.

The control method provided in the present disclosure is applied in the control circuit as shown in FIG. 3, and their implementations and principles are the same, and details will not be described herein again.

In addition, an embodiment of the present disclosure further provides a computer readable storage medium on which a computer program is stored, and the control method as shown in the above embodiments is implemented when the computer program is executed by a processor.

An embodiment of the present disclosure further provides a front-end processor, including:

a processor; and a memory for storing an executable instruction of the processor;

where the processor is configured to perform, upon execution of the executable instruction, the control method as shown in the above embodiments.

The present disclosure also discloses another kind of control circuit, which will be illustrated in the following with reference to the accompany figures.

Figure 29:
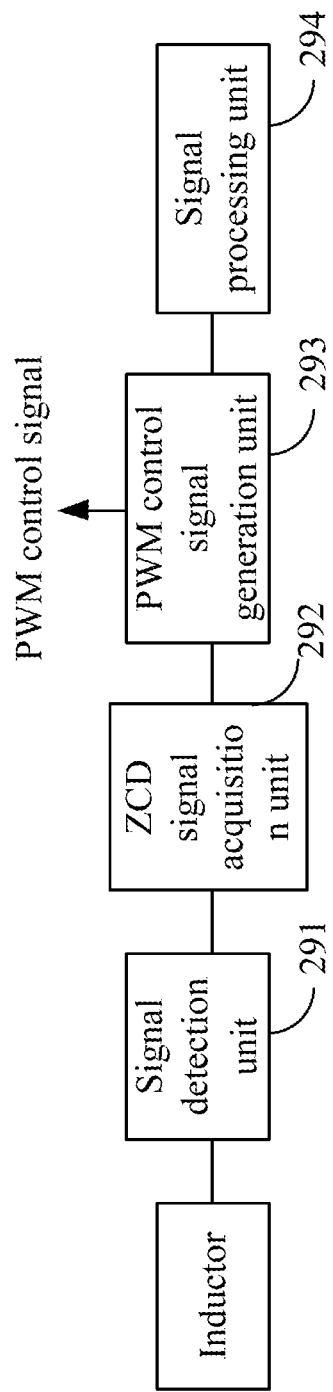
FIG. 29 is a schematic structural diagram of a control circuit according to another embodiment of the present disclosure.

Specifically, FIG. 29 is a schematic structural diagram of a control circuit according to another embodiment of the present disclosure. In the embodiment as shown in FIG. 29, the control circuit includes: a signal detection unit 291, a ZCD signal acquisition unit 292, a pulse-width modulation (PWM) control signal generation unit 293, and a signal processing unit 294.

The signal detection unit 291, the ZCD signal acquisition unit 292, the PWM control signal generation unit 293, and the signal processing unit 294 are connected in cascade.

The signal detection unit 291 is further connected to an alternating current (AC)-side inductor (the inductor as shown in FIG. 1) of an AC/direct current (DC) converter and configured to detect a voltage of the AC-side inductor and output an inductor voltage detection signal, where the inductor voltage detection signal is an AC signal.

The ZCD signal acquisition unit 292 receives the inductor voltage detection signal, generates a zero-crossing detection (ZCD) signal of the voltage of the AC-side inductor, and outputs the ZCD signal to the PWM control signal generation unit 293.

The PWM control signal generation unit 293 receives the ZCD signal output by the ZCD signal acquisition unit 292 and an input voltage phase signal, generates, according to the ZCD signal, a pulse signal of a preset threshold frequency and the input voltage phase signal, a ZCD trigger signal having a frequency that is no greater than the preset threshold frequency, and outputs the ZCD trigger signal to the signal processing unit 294.

The signal processing unit 294 receives the ZCD trigger signal output by the PWM control signal generation unit 293, generates a pulse width signal and a pulse signal of a preset threshold frequency, and returns the pulse width signal and the pulse signal of the preset threshold frequency to the PWM control signal generation unit 293.

The PWM control signal generation unit 293 further generates a PWM control signal for the AC/DC converter according to the ZCD trigger signal, the pulse width signal, the input voltage phase signal, the ZCD signal, and the pulse signal of the preset threshold frequency so that the AC/DC converter is controlled.

It can be seen that the signal processing unit 294 is mainly configured to generate a pulse width signal and a pulse signal of a preset threshold frequency according to the received ZCD trigger signal, and send them back to the PWM control signal generation unit 293 so that the PWM control signal generation unit 293 conducts signal selection, performs frequency-limitation for the ZCD signal using the pulse signal of the preset threshold frequency, and generates the PWM control signal.

In an embodiment, the signal detection unit 291, the ZCD signal acquisition unit 292, the signal processing unit 294, and the PWM control signal generation unit 293 are all constructed with analog circuits.

In an embodiment, the signal processing unit 294 includes an analog control chip or a digital control chip. The signal processing unit 294 may be, for example, a microcontroller unit (MCU) or an IC controller.

In an embodiment, the signal processing unit 294 receives the ZCD trigger signal, generates a pulse width signal having a first preset duration after a first preset delay time has elapsed, and sends the pulse width signal to the PWM control signal generation unit 293. In the embodiment, the PWM control signal generation unit is configured such that: the output PWM control signal for the AC/DC converter is at a high level when any one of the ZCD trigger signal and the pulse width signal is at a high level.

In an embodiment, the signal processing unit 294 receives the ZCD trigger signal, generates the pulse signal of the preset threshold frequency after a second preset delay time has elapsed, and sends the pulse signal of the preset threshold frequency to the PWM control signal generation unit 293, where the pulse signal of the preset threshold frequency has a second preset duration.

In summary, the control circuit provided in this embodiment uses the signal detection unit, the ZCD signal acquisition unit, the PWM control signal generation unit and the signal processing unit to combine the detection of the inductor voltage, the acquisition of the ZCD signal, and the frequency limiting of the ZCD signal together by means of different units. The inductor voltage signal is sent to the signal processing unit after it is detected, and then the PWM signal is generated and sent subsequently, so the delay time is very low. Compared with the prior art where the selection and the frequency limiting of the inductor voltage ZCD signal as well as the generation of the PWM control signal are all implemented by a digital processor, the signal processing procedure is simplified, the delay of control signal is eliminated, the requirement on performance of the processor is reduced, therefore the requirement of controlling of the entire PFC system is met due to improved accuracy of the signal processing in the PFC system.

Figure 30:
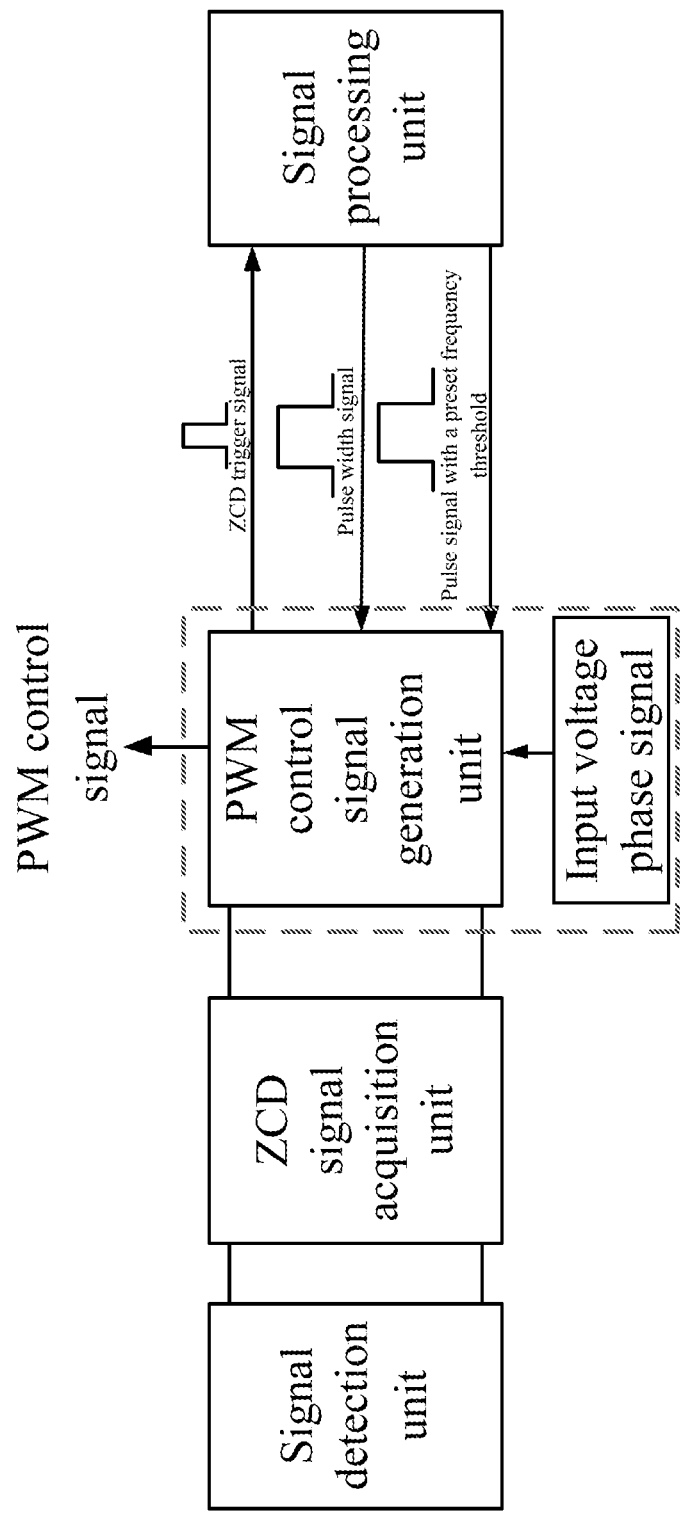
FIG. 30 is a schematic structural diagram of a control circuit according to another embodiment of the present disclosure.

Further, FIG. 30 is a schematic structural diagram of a control circuit according to another embodiment of the present disclosure. The control circuit as shown in FIG. 30 is based on the embodiment as shown in FIG. 29, where the PWM control signal generation unit 293 is configured to: when the input voltage phase signal is at a first level, maintain the ZCD trigger signal at a low level if the pulse signal of the preset threshold frequency is at a high level; generate an ascending edge of the ZCD trigger signal upon arrival of a first edge signal for the ZCD signal if the pulse signal of the preset threshold frequency is at a low level.

The level (first level) of the input voltage phase signal has a certain correspondence with the first edge signal of the ZCD signal.

One possible implementation of the above-described embodiment lies in: the first edge signal represents an ascending edge when the first level is a high level, and the first edge signal represents a descending edge when the first level is a low level.

Figure 31:
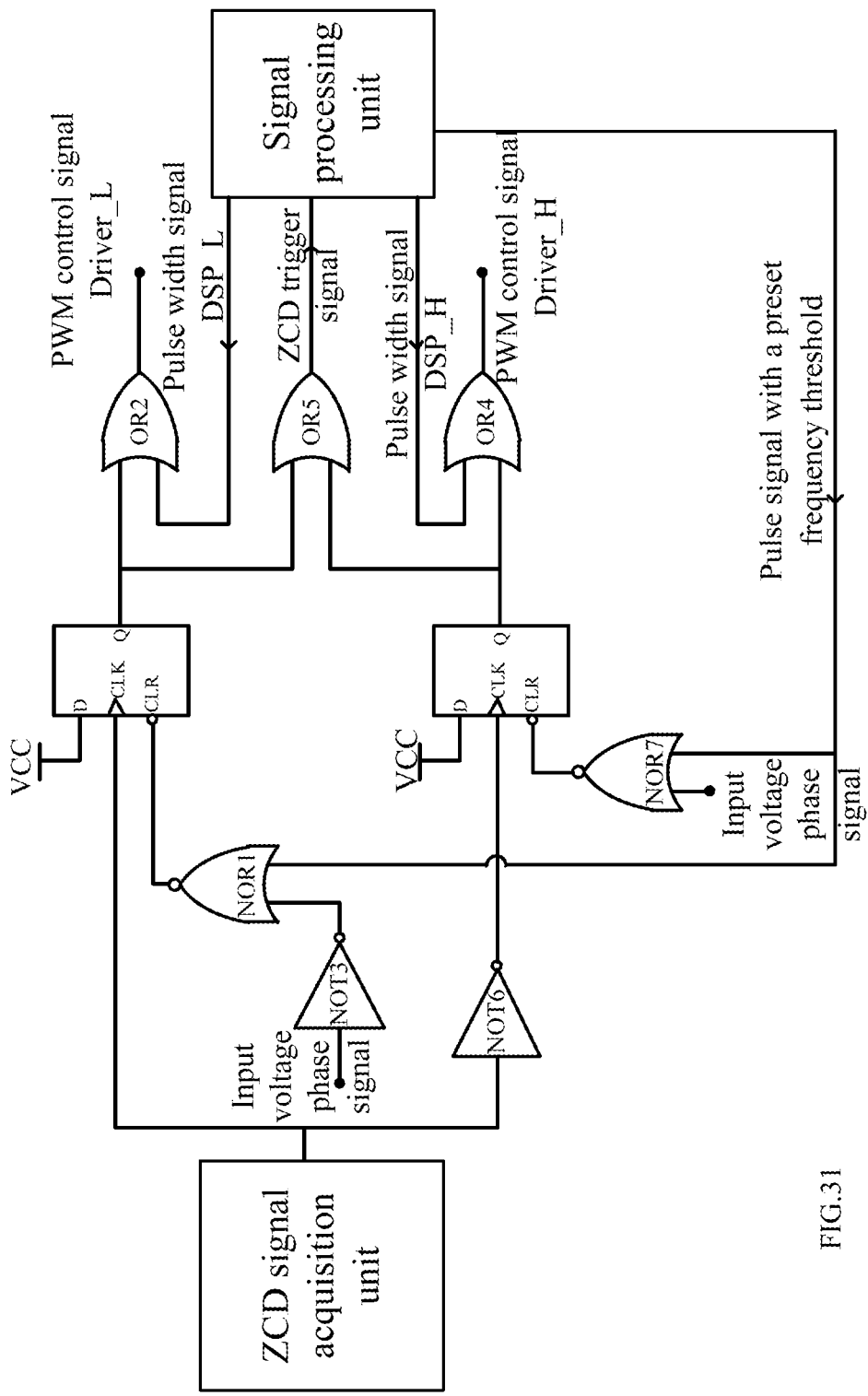
FIG. 31 is a schematic structural diagram of a PWM control signal generation unit according to the present disclosure.

Specifically, FIG. 31 is a schematic structural diagram of a circuit for a PWM control signal generation unit according to the present disclosure. FIG. 31 is a specific circuit implementation on the basis of the PWM control signal generation unit shown in the embodiment as shown in FIG. 29. As shown in FIG. 31, the PWM control signal generation unit in this embodiment includes a first logical NOR gate operator (such as NOR1 and NOR7 shown in FIG. 31), a D flip-flop with an asynchronous clear function, and a second logical OR gate operator (such as OR2 and OR4 shown in FIG. 31), where a first input of the first logical NOR gate operator receives the pulse signal of the preset threshold frequency from the signal processing unit 294, and an output thereof is connected to a clear terminal (that is, the CLR terminal shown in FIG. 31) of the D flip-flop; the D flip-flop has its data input (that is, the D terminal shown in FIG. 31) connected to a high level (which may be, for example, VCC shown in FIG. 31); the D flip-flop has its data output (that is, the Q terminal shown in FIG. 31) connected to a first input of the second logical OR gate operator. The second logical OR gate operator has its second input connected to the pulse width signal output by the signal processing unit 294; and the second logical OR gate operator outputs the PWM control signal for the AC/DC converter.

In an embodiment, the PWM control signal generation unit further includes a third logical NOT gate operator (such as NOT3 and NOT6 shown in FIG. 31).

When the first level is a high level, the first logical NOR gate operator (such as NOR1 shown in FIG. 31), the second logical OR gate operator (such as OR2 shown in FIG. 31) and the third logical NOT gate operator (such as NOT3 shown in FIG. 31) included in the PWM control signal generation unit operate; when the first level is a low level, the first logical NOR gate operator (such as NOR7 shown in FIG. 31), the second logical OR gate operator (such as OR4 shown in FIG. 31) and the third logical NOT gate operator (such as NOT6 shown in FIG. 31) included in the PWM control signal generation unit operate.

When the first level is a high level, an input of the third logical NOT gate operator receives the input voltage phase signal, an output thereof is connected to a second input of the first logical NOR gate operator, and a clock signal terminal (such as the CLK terminal shown in FIG. 31) of the D flip-flop receives the ZCD signal. With regard to this embodiment, the first logical NOR gate operator may be NOR1 shown in FIG. 31, the second logical OR gate operator may be OR2 shown in FIG. 31, and the third logical NOT gate operator may be NOT3 shown in FIG. 31.

When the first level is a low level, the input of the third logical NOT gate operator receives the ZCD signal, the output thereof is connected to a clock signal terminal (such as the CLK terminal shown in FIG. 31) of the D flip-flop the D flip-flop, and the second input of the first logical NOR gate operator receives the input voltage phase signal. With regard to this embodiment, the first logical NOR gate operator may be NOR7 shown in FIG. 31, the second logical OR gate operator may be OR4 shown in FIG. 31, and the third logical NOT gate operator may be NOTE shown in FIG. 5.

It should be noted that the above description and the corresponding drawings are simply one specific implementation of the PWM control signal generation unit, and each device may be adjusted according to actual conditions.

In an embodiment, the D flip-flop described above may also be a D flip-flop with an asynchronous set function. In this case, the D flip-flop with the asynchronous set function may have its data input (that is, the D terminal) connected to ground (GND), which may be achieved by modifying the logic operations described above.

In an embodiment, the D flip-flop described above may also comprise a plurality of logical gate operators, which in combination can realize the function of a D flip-flop.

In an embodiment, the third logical NOT gate operator may also be replaced with a NAND gate operator, a NOR gate operator, or the like. For example, since the logical NOT gate operator has only one input and the NAND gate operator or the NOT gate operator has two inputs, when the NAND gate operator or the NOT gate operator is used, the two inputs thereof may be combined together and then connected with respective signals so that the above-described circuit may be implemented likewise. Certainly, other implementations may be used, the above-described third logical NOT gate operator is implemented by using the NAND gate operator as an example, in which one input of the NAND gate operator may be connected to a high level and the other input may be connected with a corresponding signal so that the NOT operation is implemented.

It should be noted that specific implementations of the above-described logical operators are not limited in the present disclosure.

According to FIG. 31, when the input voltage phase signal is at a high level, if the pulse signal of the preset threshold frequency is at a high level, after the operation of the third logical NOT gate operator NOT3, the first logical NOR gate operator NOR1, the D flip-flop, and the second logical OR gate operator OR2, the ZCD trigger signal obtained at this point is at a low level; an ascending edge of the ZCD trigger signal is generated upon arrival of an ascending edge of the ZCD signal if the pulse signal of the preset threshold frequency is at a low level.

When the input voltage phase signal is at a low level, if the pulse signal of the preset threshold frequency is at a high level, after the operation of the third logical NOT gate operator NOTE, the first logical NOR gate operator NOR7, the D flip-flop, and the second logical OR gate operator OR4, the ZCD trigger signal obtained at this point is at a low level; an ascending edge of the ZCD trigger signal is generated upon arrival of a descending edge of the ZCD signal if the pulse signal of the preset threshold frequency is at a low level.

Figure 32:
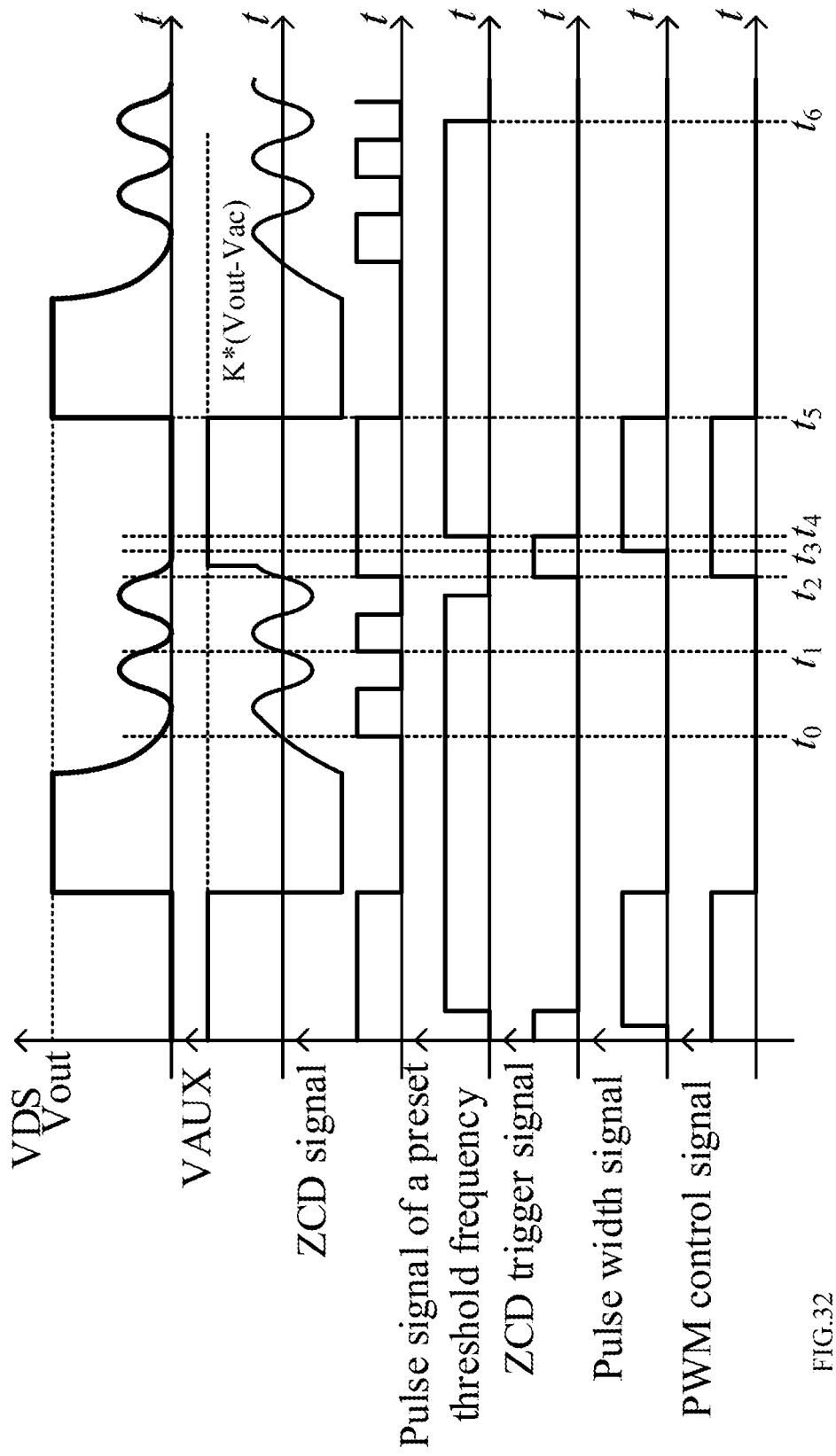
FIG. 32 is a schematic diagram illustrating timing of signals of a PWM control signal generation unit according to the present disclosure.
Figure 33:
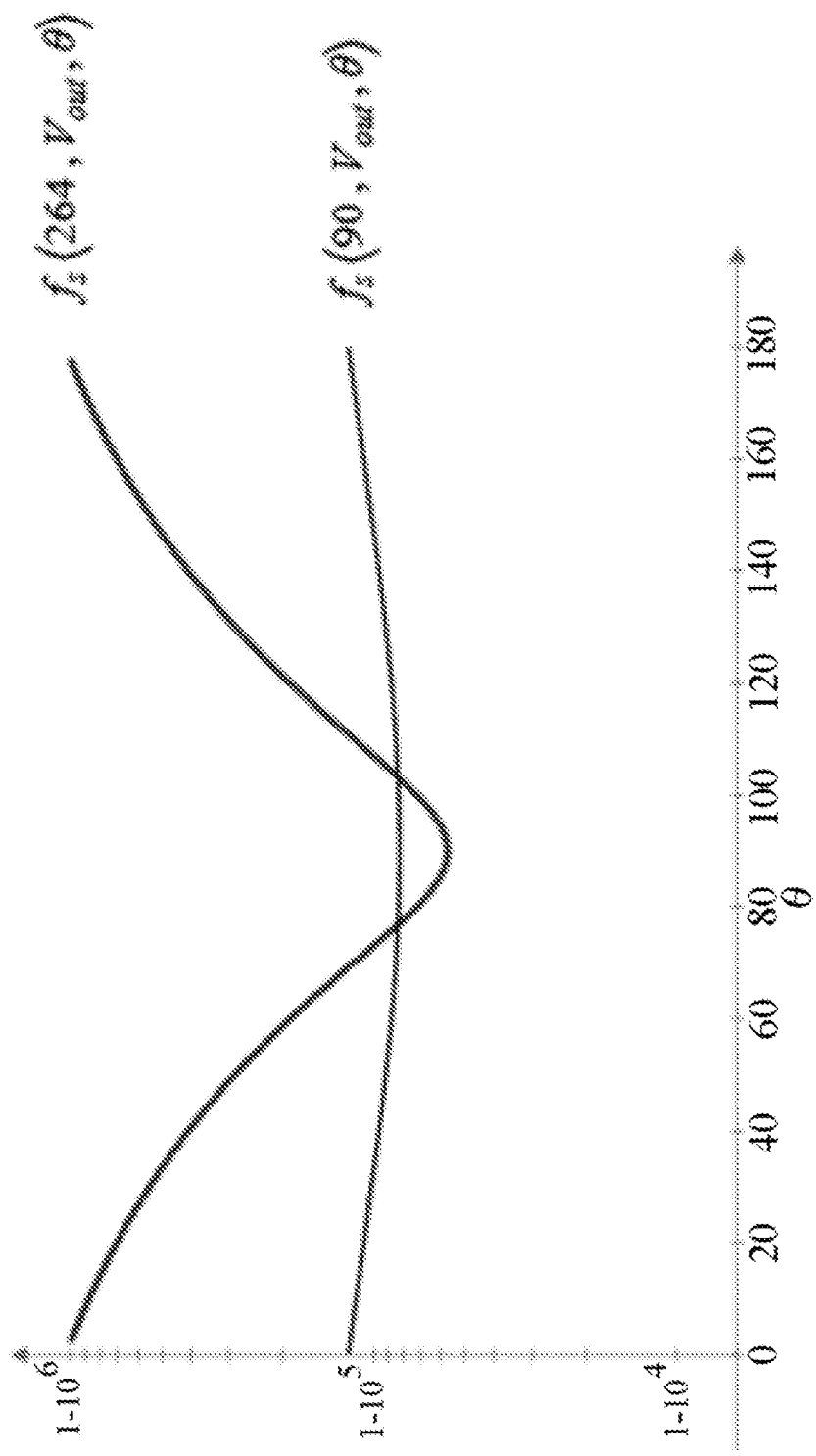
FIG. 33 is a schematic diagram of a relationship between angle and operating frequency during a half sine cycle of mains frequency according to the present disclosure.

A further description will be given hereunder to a delay time involved in the control circuit of the present disclosure. FIG. 32 is a schematic diagram illustrating timing of frequency-limited signals of a PWM control signal generation unit according to the present disclosure; FIG. 33 is a schematic diagram of a relationship between angle and operating frequency during a half sine cycle of mains frequency according to the present disclosure.

Specifically, FIG. 32 is an operating state in which the signal processing unit controls timing of the output PWM control signal in a discontinuous conduction mode under a PFC operating condition. Vout is an output voltage of a PFC converter. VDS is a voltage of a terminal of a high-frequency switching device to which the inductor L is connected with respect to a negative terminal of the PFC output voltage, VAUX is a voltage of an auxiliary winding, and the VAUX voltage is the product of the voltage of the inductor and a fixed coefficient.

When the signal processing unit receives the ZCD trigger signal at the time $t_2$, delays a first preset delay time (a period from $t_2$ to $t_3$), then generates and sends a pulse width signal to the PWM control signal generation unit; further, when the signal processing unit receives the ZCD trigger signal at the time $t_2$, also delays a second preset delay time (a period from $t_2$ to $t_4$), then generates and sends a pulse signal of a preset threshold frequency to the PWM control signal generation unit.

The first preset delay time is a time required for the signal processing unit to process the ZCD trigger signal so that a pulse width signal is generated, which may be, for example, a period from $t_2$ to $t_3$ in FIG. 32; and the second preset delay time is a time required for the signal processing unit to process the ZCD trigger signal so that a pulse signal of a preset threshold frequency is generated, which may be, for example, a period from $t_2$ to $t_4$ in FIG. 32. The pulse width signal generated by the signal processing unit has a first duration, which may be, for example, a period from $t_3$ to $t_5$ in FIG. 32; the pulse signal of the preset threshold frequency generated by the signal processing unit has a second preset duration, which may be, for example, a period from $t_5$ to $t_6$ in FIG. 32, during which the ZCD signal takes no effect, so that to limit the minimum operation cycle of the converter.

In addition, for a PWM control signal generated by the PWM control signal generation unit, the PWM control signal is at a high level when either of the ZCD trigger signal or the pulse width signal is at a high level.

Further, to illustrate the existing technical problems in conventional PFC system, FIG. 33 shows a relationship between angle and operating frequency during a half sine cycle of mains frequency of the input voltage Vac under a Discontinuous Conduction Mode Boundary (DCMB) PFC condition. For the DCMB PFC, a high operating frequency is required in a vicinity of zero voltage crossing points, i.e. 0 degree and 180 degrees of the input Vac, in particular, the frequency will reach MHz for a high voltage application. Meanwhile, since there is not much energy transferred in the vicinity of the zero voltage crossing points, the high frequency will lead to considerable switching loss. Therefore, it is necessary to limit the frequency of the ZCD trigger signal so as to limit the high frequency switching loss at the zero voltage crossing points of the input Vac.

In summary, with the control circuit provided in the present disclosure, after the signal processing unit receives a ZCD trigger signal, fast processing is performed to return a pulse width signal and a pulse signal of a preset threshold frequency to the PWM control signal generation unit, so that the PWM control signal generation unit can quickly generate a PWM control signal, thereby reducing a processing delay of the ZCD signal and improving a signal processing accuracy of a PFC system.

Figure 34:
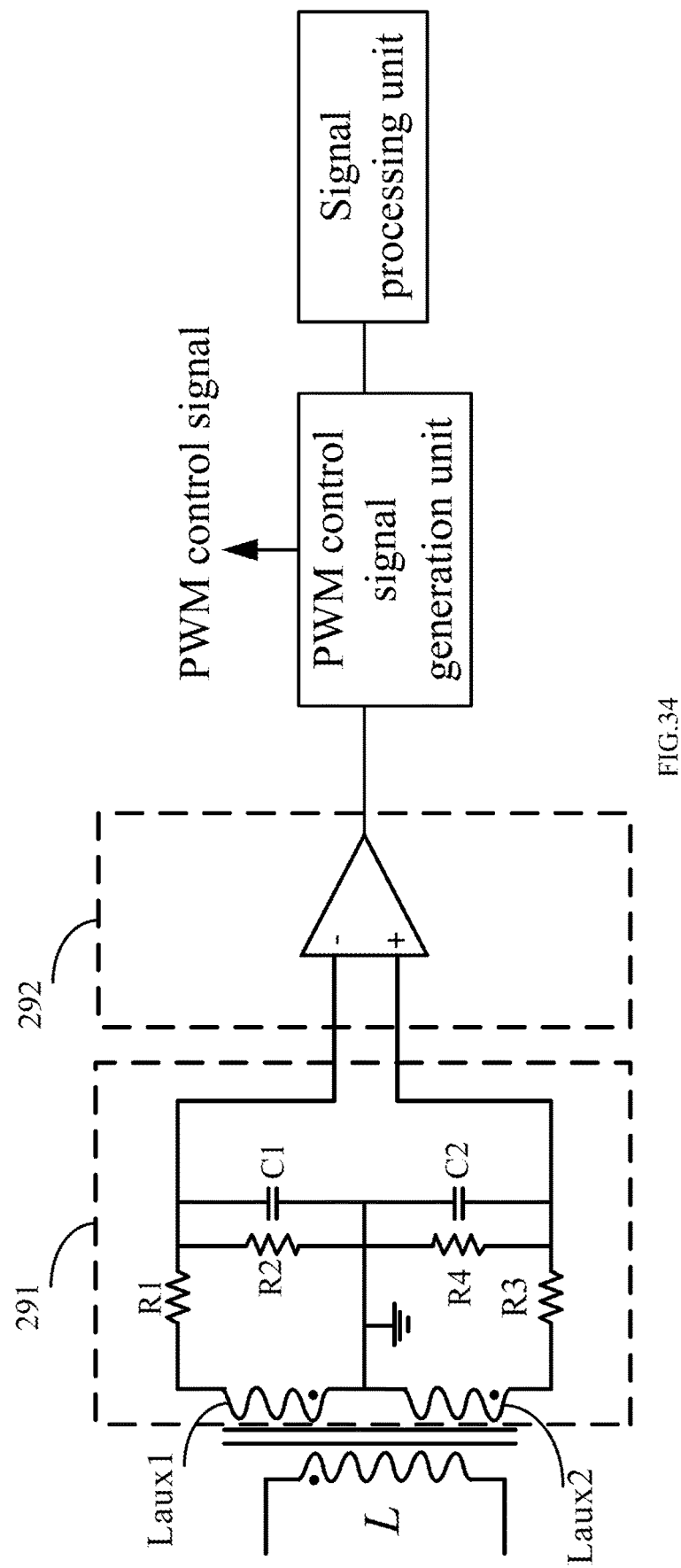
FIG. 34 is a schematic structural diagram of a control circuit according to another embodiment of the present disclosure.

FIG. 34 is a schematic structural diagram of a control circuit according to a third embodiment of the present disclosure. In FIG. 34, the inductor L is coupled with a first winding and a second winding in the signal detection unit, a signal transmission is thereby realized. As shown in FIG. 34, the signal detection unit 291 includes: a first winding Laux1, a second winding Laux2, a first resistor R1, a second resistor R2, a third resistor R3, a fourth resistor R4, a first capacitor C1 and a second capacitor C2. The ZCD signal acquisition unit 292 includes a comparator. The first winding Laux1 and the second winding Laux2 are coupled with an inductor $L_{PFC}$ at an input of the PFC circuit and configured to obtain a voltage of an input AC of the PFC circuit via a voltage of the inductor; a first end of the first winding Laux1 is connected to a first end of the first resistor R1, a second end of the first resistor R1 is connected to a first end of the second resistor R2, a first end of the first capacitor C1 and a negative input of the comparator; a second end of the first winding Laux1 is connected to a first end of the second winding Laux2, a second end of the first capacitor C1, a first end of the second capacitor C2, a second end of the second resistor R2 and a first end of the fourth resistor R4; a second end of the second winding Laux2 is connected to a first end of the third resistor R3; and a second end of the third resistor R3 is connected to a second end of the second capacitor C2, a second end of the fourth resistor R4 and a positive input of the comparator; an output of the comparator outputs the zero-crossing detection signal to the PWM control signal generation unit.

Further, reference may be made to FIG. 12A and FIG. 12B for the diagram and description of timing of an inductor voltage detection signal and a zero-crossing detection signal of a control circuit according to a third embodiment of the present disclosure, which will not be elaborated in detail herein.

In an embodiment, the zero-crossing detection signal as shown in the above embodiment includes a phase signal of the voltage Vac. Correspondingly, the zero-crossing detection signal may also include: a voltage signal during positive half cycle of and a voltage signal during negative half cycle of the voltage. Adjustments need to be made to circuit structures of the signal detection unit, the ZCD signal acquisition unit, and the PWM control signal generation unit, respectively.

In practice, there may be other implementations for the signal detection unit and the ZCD signal acquisition unit.

Besides, regarding the description and figures of the structural diagrams of the signal detection unit shown in FIG. 29, reference may be made to FIG. 15-FIG. 17, which will not be elaborated in detail herein.

Regarding the description and figures of the structural diagrams of the ZCD signal acquisition unit shown in FIG. 29, reference may be made to FIG. 18-FIG. 21, which will not be elaborated in detail herein. It should be noted that, here in FIG. 29 the ZCD signal acquisition unit is connected to the PWM control signal generation unit, therefore, the signal selection unit in the description of FIG. 18-FIG. 21 should be replaced by the PWM control signal generation unit.

Finally, it should be noted that the foregoing embodiments are merely intended for describing the technical solutions of the present disclosure rather than limiting the present disclosure. Although the present disclosure is described in detail with reference to the foregoing embodiments, persons of ordinary skill in the art should understand that they may still make modifications to the technical solutions described in the foregoing embodiments, or make equivalent replacements to some or all technical features therein; however, these modifications or replacements do not make the essence of corresponding technical solutions depart from the scope of the technical solutions in the embodiments of the present disclosure.

What is claimed is:

1. A control circuit for outputting a pulse width modulation (PWM) control signal, comprising:
   a signal detection unit, coupled to an alternating current (AC)-side inductor of an AC/direct current (DC) converter, which is configured to detect a voltage of the AC-side inductor and output an inductor voltage detection signal, wherein the inductor voltage detection signal is an AC signal;
   a zero-crossing detection (ZCD) signal acquisition unit, coupled to the signal detection unit, which is configured to receive the inductor voltage detection signal, generate a ZCD signal of the voltage of the AC-side inductor, and output the ZCD signal to the PWM control signal generation unit;
   a PWM control signal generation unit, coupled to the ZCD signal acquisition unit, which is configured to receive the ZCD signal and an input voltage phase signal, generate, according to the ZCD signal, a pulse signal of a preset threshold frequency and the input voltage phase signal, a ZCD trigger signal having a frequency that is no greater than the preset threshold frequency, and output the ZCD trigger signal to the signal processing unit; and
   a signal processing unit, coupled to the PWM control signal generation unit, which is configured to receive the ZCD trigger signal, generate a pulse width signal and a pulse signal of a preset threshold frequency, and return the pulse width signal and the pulse signal of the preset threshold frequency to the PWM control signal generation unit;
   wherein the PWM control signal generation unit is further configured to generate a PWM control signal for the AC/DC converter according to the pulse width signal, the input voltage phase signal, the ZCD signal, and the pulse signal of the preset threshold frequency.

2. The circuit according to claim 1, wherein the signal detection unit, the ZCD signal acquisition unit, and the PWM control signal generation unit are constructed with analog circuits.

3. The circuit according to claim 1, wherein the signal processing unit comprises an analog control chip or a digital control chip.

4. The circuit according to claim 1, wherein the PWM control signal generation unit is configured to:
   when the input voltage phase signal is at a first level, maintain the ZCD trigger signal at a low level if the pulse signal of the preset threshold frequency is at a high level; generate an ascending edge of the ZCD trigger signal upon arrival of a first edge signal for the ZCD signal if the pulse signal of the preset threshold frequency is at a low level.

5. The circuit according to claim 4, wherein the first edge signal has an ascending edge when the first level is a high level, and the first edge signal has a descending edge when the first level is a low level.

6. The circuit according to claim 1, wherein the signal processing unit is configured to receive the ZCD trigger signal, generate the pulse width signal having the first preset duration after a first preset delay time has elapsed, and send the pulse width signal to the PWM control signal generation unit.

7. The circuit according to claim 1, wherein the signal processing unit is configured to receive the ZCD trigger signal, generate the pulse signal of the preset threshold frequency after a second preset delay time has elapsed, and send the pulse signal of the preset threshold frequency to the PWM control signal generation unit, wherein the pulse signal of the preset threshold frequency has a second preset duration.

8. The circuit according to claim 6, wherein the PWM control signal generation unit is configured such that:
   the output PWM control signal for the AC/DC converter is at a high level when any one of the ZCD trigger signal and the pulse width signal is at a high level.

9. The circuit according to claim 4, wherein the PWM control signal generation unit comprises: a first logical NOR gate operator, a D flip-flop with an asynchronous clear function, and a second logical OR gate operator, wherein:
   a first input of the first logical NOR gate operator receives the pulse signal of the preset threshold frequency, and an output of the first logical NOR gate operator is connected to a clear terminal of the D flip-flop;
   a data input of the D flip-flop is connected to a high level;
   a data output of the D flip-flop is connected to a first input of the second logical OR gate operator;
   a second input of the second logical OR gate operator is connected to the pulse width signal; and
   the second logical OR gate operator outputs the PWM control signal for the AC/DC converter.

10. The circuit according to claim 9, wherein the PWM control signal generation unit further comprises a third logical NOT gate operator, wherein:
    when the first level is a high level, an input of the third logical NOT gate operator receives the input voltage phase signal, an output of the third logical NOT gate operator is connected to a second input of the first logical NOR gate operator, and a clock signal terminal of the D flip-flop receives the ZCD signal;
    when the first level is a low level, the input of the third logical NOT gate operator receives the ZCD signal, the output of the third logical NOT gate operator is connected to a clock signal terminal of the D flip-flop, and the second input of the first logical NOR gate operator receives the input voltage phase signal.

11. The circuit according to claim 10, wherein the signal detection unit comprises a first winding, a second winding, a first resistor, a second resistor, a third resistor, a fourth resistor, a first capacitor, and a second capacitor; wherein the ZCD signal acquisition unit comprises a comparator;
    the first winding and the second winding are coupled to the AC-side inductor and configured to obtain an voltage applied on a switching device in the AC/DC converter through a voltage of the inductor; a first end of the first winding is connected to a first end of the first resistor, a second end of the first resistor is connected to a first end of the second resistor, a first end of the first capacitor and a negative input of the comparator; a second end of the first winding is connected to a first end of the second winding, a second end of the first capacitor, a first end of the second capacitor, a second end of the second resistor and a first end of the fourth resistor; a second end of the second winding is connected to a first end of the third resistor; and a second end of the third resistor is connected to a second end of the second capacitor, a second end of the fourth resistor and a positive input of the comparator; an output of the comparator outputs the ZCD signal to the PWM control signal generation unit.

12. The circuit according to claim 1, wherein the ZCD signal comprises a positive half cycle of voltage signal and a negative half cycle of voltage signal of the AC-side inductor.

13. A control method for operating the control circuit according to claim 1, comprising:
   detecting the voltage of an alternating current (AC)-side inductor;
   generating the zero-crossing detection (ZCD) signal according to the voltage of the AC-side inductor;
   generating the ZCD trigger signal of a frequency no greater than the preset threshold frequency, according to the ZCD signal, the pulse signal of a preset threshold frequency and the input voltage phase signal;
   generating the pulse width signal and the pulse signal of a preset threshold frequency, according to the ZCD trigger signal; and
   generating the PWM control signal for the AC/DC converter according to the pulse width signal, the input voltage phase signal, the ZCD signal, and the pulse signal of the preset threshold frequency.

* * * * *